(12) United States Patent
Kurozuka et al.

(10) Patent No.: US 10,514,540 B2
(45) Date of Patent: Dec. 24, 2019

(54) LIGHT SOURCE DEVICE AND IMAGE DISPLAY DEVICE

(71) Applicant: Panasonic Intellectual Property Management Co., Ltd., Osaka (JP)

(72) Inventors: Akira Kurozuka, Osaka (JP); Yuta Yamamoto, Kyoto (JP); Susumu Uragami, Osaka (JP); Hiroyuki Furuya, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 34 days.

(21) Appl. No.: 16/013,981

(22) Filed: Jun. 21, 2018

(65) Prior Publication Data

US 2019/0018239 A1 Jan. 17, 2019

(30) Foreign Application Priority Data

Jul. 11, 2017 (JP) .................. 2017-135405

(51) Int. Cl.
*H01S 5/068* (2006.01)
*G02B 27/01* (2006.01)
(Continued)

(52) U.S. Cl.
CPC .......... *G02B 27/0101* (2013.01); *B60K 35/00* (2013.01); *G02B 27/141* (2013.01);
(Continued)

(58) Field of Classification Search
CPC ........ B60K 2370/333; B60K 2370/334; B60K 35/00; G02B 27/0101; G02B 27/141;
(Continued)

(56) References Cited

U.S. PATENT DOCUMENTS 5,812,572 A * 9/1998 King ................... H01S 5/06213
372/26
6,055,252 A * 4/2000 Zhang ..................... H01S 5/068
372/26

(Continued)

FOREIGN PATENT DOCUMENTS

JP 2014-086426 5/2014

*Primary Examiner* — Bao-Luan Q Le
(74) *Attorney, Agent, or Firm* — McDermott Will & Emery LLP

(57) ABSTRACT

The disclosure provides a light source device and an image display device. The light source device includes a laser light source configured to emit laser light having a wavelength in a range from 635 nm to 645 nm inclusive, a temperature sensor configured to detect temperature around the light source device, and a laser control circuit configured to control the laser light source. The laser control circuit approximates, with use of a quartic expression, change in threshold current of the laser light source relative to temperature, and approximates, with use of a quadratic expression, change in slope efficiency of the laser light source relative to temperature, to obtain threshold current and slope efficiency of the laser light source corresponding to detection temperature of the temperature sensor, and controls the laser light source in accordance with the threshold current and the slope efficiency thus obtained.

11 Claims, 14 Drawing Sheets

(51) Int. Cl.
*G03B 21/20* (2006.01)
*G02B 27/14* (2006.01)
*B60K 35/00* (2006.01)
*G02B 27/30* (2006.01)
*H01S 5/0683* (2006.01)
*H04N 9/31* (2006.01)
*H01S 5/06* (2006.01)

(52) U.S. Cl.
CPC ......... *G02B 27/30* (2013.01); *G03B 21/2033* (2013.01); *H01S 5/0617* (2013.01); *H01S 5/0683* (2013.01); *H01S 5/06804* (2013.01); *H01S 5/06808* (2013.01); *H01S 5/06812* (2013.01); *H01S 5/06835* (2013.01); *H01S 5/06837* (2013.01); *H04N 9/3129* (2013.01); *H04N 9/3135* (2013.01); *B60K 2370/333* (2019.05); *B60K 2370/334* (2019.05); *H04N 9/3194* (2013.01)

(58) Field of Classification Search
CPC ................ G02B 27/30; G03B 21/2033; G03B 21/2053; H04N 9/3129; H04N 9/3135; H04N 9/3194; H01S 5/0617; H01S 5/06804; H01S 5/06808; H01S 5/06812; H01S 5/0683; H01S 5/06835; H01S 5/06837
See application file for complete search history.

(56) References Cited

U.S. PATENT DOCUMENTS

| | | | | |
|---|---|---|---|---|
| 6,556,607 | B1 * | 4/2003 | Jewell | H01S 5/0612 372/49.01 |
| 6,980,579 | B2 * | 12/2005 | Jewell | H01S 5/0612 372/45.01 |
| 7,054,343 | B1 * | 5/2006 | Wu | H01S 5/0014 372/32 |
| 7,321,606 | B2 * | 1/2008 | Wu | H01S 5/0014 372/29.011 |
| 7,433,375 | B2 * | 10/2008 | Wu | H01S 5/0014 372/26 |
| 7,542,493 | B2 * | 6/2009 | Jewell | H01S 5/0612 372/33 |
| 7,616,671 | B2 * | 11/2009 | Kamijima | H04N 9/3194 372/21 |
| 7,715,728 | B2 * | 5/2010 | Kijima | G02B 6/4201 372/29.015 |
| 8,457,499 | B2 * | 6/2013 | Hamana | H01S 5/06804 372/32 |
| 8,611,384 | B2 * | 12/2013 | Tatum | H01S 5/183 372/29.012 |
| 2003/0165171 | A1 * | 9/2003 | Jewell | H01S 5/0612 372/46.01 |
| 2005/0078721 | A1 * | 4/2005 | Wu | H01S 5/0014 372/38.01 |
| 2005/0078722 | A1 * | 4/2005 | Wu | H01S 5/0014 372/38.01 |
| 2006/0062266 | A1 * | 3/2006 | Jewell | H01S 5/0612 372/43.01 |
| 2007/0268943 | A1 * | 11/2007 | Tatum | H01S 5/183 372/29.012 |
| 2007/0280702 | A1 * | 12/2007 | Kijima | G02B 6/4201 398/192 |
| 2008/0175286 | A1 * | 7/2008 | Kamijima | H01S 5/4062 372/30 |
| 2012/0134681 | A1 * | 5/2012 | Hamana | H01S 5/06804 398/141 |

* cited by examiner

FIG.11A

| Color temperature | 638nm | 520nm | 450nm |
|---|---|---|---|
| 6500K | 1.49 | 1 | 0.60 |
| 9000K | 1.34 | 1 | 0.75 |
| 9500K | 1.32 | 1 | 0.77 |

FIG.11B

| Luminance level | Magnification (%) | WB correction (red) | WB correction (blue) |
|---|---|---|---|
| 1 | 100 | Cr1 | Cb1 |
| 2 | 86 | Cr2 | Cb2 |
| 3 | 75 | Cr3 | Cb3 |
| 4 | 64 | Cr4 | Cb4 |
| 5 | 56 | Cr5 | Cb5 |
| 6 | 48 | Cr6 | Cb6 |
| 7 | 41 | Cr7 | Cb7 |
| 8 | 34 | Cr8 | Cb8 |
| 9 | 30 | Cr9 | Cb9 |

LIGHT SOURCE DEVICE AND IMAGE DISPLAY DEVICE

BACKGROUND

1. Technical Field

The present disclosure relates to a light source device and an image display device including the light source device, which are suitably mounted on a movable body such as a passenger vehicle.

2. Description of the Related Art

In recent years, an image display device called a head-up display has been developed and mounted on a movable body such as a passenger vehicle. In the head-up display mounted on the passenger vehicle, light modulated in accordance with image information is projected toward a windshield, and light reflected by the windshield is applied to driver's eyes. The driver can then view a virtual image of the display image ahead of the windshield. Examples of the displayed virtual image include drive assist information such as vehicle speed and various alert marking.

The head-up display can include a laser light source functioning as a light source. Laser light scans a screen while being modulated in accordance with a video signal. The laser light is then diffused on the screen and is guided to an eye box near the driver's eyes. The driver can thus see the image (virtual image) finely and stably even if the driver slightly moves one's head. The eye box has a laterally-long rectangular shape or the like.

A laser light source has an output characteristic changed by temperature change. In the above case where the laser light source is applied as a light source, the laser light source needs to be controlled to have restrained output variation caused by temperature change.

In contrast, PTL 1 describes a configuration for detection of laser light emission intensity successively with use of a photodetector to restrain output variation of a laser light source caused by temperature change. According to this configuration, laser light scans a screen in a region outside an image display region during image display operation. In this case, the laser light source is driven with two or more values of current larger than threshold current required for laser oscillation. The photodetector detects emission intensity of the laser light source driven at each of the current values. The output characteristic of the laser light source at each point is obtained in accordance with a corresponding one of detected values. Output of the laser light source is controlled in accordance with the output characteristic thus obtained.

CITATION LIST

Patent Literature

PTL 1: Unexamined Japanese Patent Publication No. 2014-86426

SUMMARY

The configuration according to PTL 1 requires that the screen has a detection light emitting region and a display region for image display and these regions are sufficiently apart from each other, to prevent laser light from affecting the display region when the laser light scans the screen in the detection light emitting region outside the display region during image display operation. Such disposition shortens image display time during a single frame display period and thus largely lowers utilization efficiency of laser light to the image. This leads to deterioration in image luminance. The laser light source needs to be improved greatly in output to prevent such deterioration.

In view of such a problem, it is an object of the present disclosure to provide a light source device and an image display device including the light source device configured to restrain variation in optical output due to temperature change with no deterioration in laser light utilization efficiency.

A first aspect of the present disclosure relates to a light source device. The light source device according to the present aspect includes a laser light source, a temperature sensor, and a laser control unit. The laser light source emits laser light having a wavelength in a range from 635 nm to 645 nm inclusive. The temperature sensor detects temperature around the laser light source. The laser controller controls the laser light source. The laser control unit approximates, with use of a quartic expression, change in threshold current of the laser light source relative to temperature, and approximates, with use of a quadratic expression, change in slope efficiency of the laser light source relative to temperature, to obtain threshold current and slope efficiency of the laser light source corresponding to detection temperature of the temperature sensor. The laser light source is controlled in accordance with the threshold current and the slope efficiency thus obtained.

The inventors have discovered that, for the laser light source configured to emit laser light having a wavelength in the range from 635 nm to 645 nm inclusive, change in threshold current relative to temperature can be approximated with use of the quartic expression and change in slope efficiency relative to temperature can be approximated with use of the quadratic expression. The inventors have devised, from this new finding, the configuration of the light source device according to the first aspect.

In the light source device according to the present aspect, threshold current and slope efficiency for present temperature are obtained by approximation with use of the quartic expression and the quadratic expression, respectively, in accordance with detection temperature. Unlike the configuration according to PTL 1, the light source device does not require scanning, with laser light, the region outside the image display region on the screen in order to check an output characteristic of the laser light source at present temperature. Variation in optical output due to temperature change can thus be restrained appropriately, with no deterioration in laser light utilization efficiency.

A second aspect of the present disclosure relates to an image display device. The image display device according to the present aspect includes a light source device including the configuration according to the first aspect as well as two additional laser light sources configured to emit laser light having a wavelength in a range from 510 nm to 530 nm inclusive and a wavelength in a range from 440 nm to 460 nm inclusive, respectively. In the light source device, the laser control unit approximates, with use of a linear expression, change in threshold current of each of the additional laser light sources relative to temperature, and approximates, with use of a linear expression, change in slope efficiency of each of the additional laser light sources relative to temperature, to obtain threshold current and slope efficiency of each of the additional laser light sources corresponding to detection temperature of the temperature sensor.

The image display device according to the present aspect includes the light source device thus configured, a screen, a scanning unit, a drive unit, and an optical system. The screen is scanned two-dimensionally by laser light beams having different wavelengths and emitted from the light source devices, to allow an image to be drawn on the screen. The scanning unit causes the laser light beams having the different wavelengths to scan the screen. The drive unit drives the scanning unit, and the optical system generates a virtual image of the image drawn on the screen. The laser control unit controls each of the laser light source and the two additional laser light sources in accordance with the threshold current and the slope efficiency thus obtained.

The inventors have discovered that, of each of the additional laser light sources, specifically, the laser light source configured to emit laser light having a wavelength in the range from 510 nm to 530 nm inclusive and the laser light source configured to emit laser light having a wavelength in the range from 440 nm to 460 nm inclusive, change in threshold current relative to temperature can be approximated with use of the linear expression and change in slope efficiency relative to temperature can be approximated with use of the linear expression. The inventors have devised, from this new finding, the configuration of the image display device according to the second aspect.

In the image display device according to the present aspect, threshold current and slope efficiency for present temperature of each of the two additional laser light sources are obtained by approximation with use of the linear expressions in accordance with detection temperature. These two additional laser light sources also can have appropriately restrained variation in optical output due to temperature change, with no deterioration in laser light utilization efficiency. This enables smooth and appropriate adjustment of a display image (e.g., adjustment of luminance and white balance) according to temperature change during image display operation with no deterioration in image quality.

As described above, the present disclosure appropriately restrains variation in optical output due to temperature change, with no deterioration in laser light utilization efficiency.

Effects or significance of the present disclosure will further be clarified in the following description of an exemplary embodiment. The exemplary embodiment described below is merely exemplary implementation of the present disclosure, and the present disclosure should not be limited to the exemplary embodiment.

BRIEF DESCRIPTION OF THE DRAWINGS

FIG. 11A is a configuration chart of a power ratio table referred to for adjustment of white balance according to the exemplary embodiment;

FIG. 11B is a configuration chart of a luminance table referred to for adjustment of luminance according to the exemplary embodiment;

DETAILED DESCRIPTION

An exemplary embodiment of the present disclosure will now be described with reference to the drawings. The drawings include X, Y, and Z axes perpendicular to one another as appropriate.

Figure 1A:
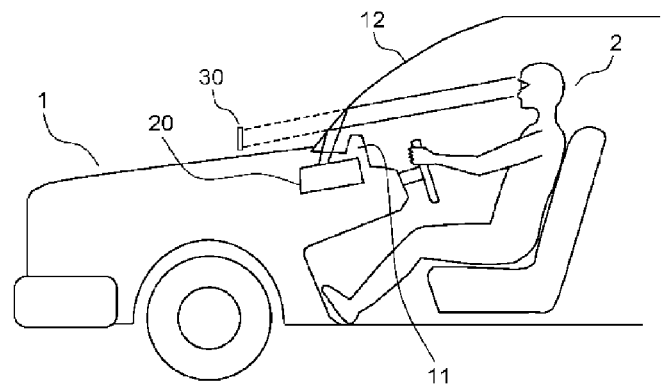
FIG. 1A is a schematic view depicting a use condition of an image display device according to an exemplary embodiment.
Figure 1B:
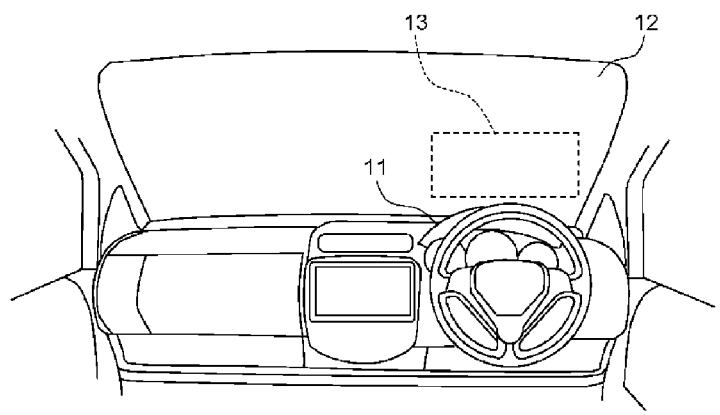
FIG. 1B is another schematic view depicting the use condition of the image display device according to the exemplary embodiment.

FIG. 1A and FIG. 1B are schematic views each depicting a use condition of image display device 20. FIG. 1A is a schematic lateral view of passenger vehicle 1, seeing through an interior of passenger vehicle 1. FIG. 1B is a view from the interior of passenger vehicle 1 in a forward travel direction.

The present exemplary embodiment relates to application of the present disclosure to an on-vehicle head-up display. As depicted in FIG. 1A, image display device 20 is installed in dashboard 11 of passenger vehicle 1.

As depicted in FIG. 1A and FIG. 1B, image display device 20 projects light modulated in accordance with a video signal, to projection region 13 located close to a driver's seat and in a lower portion of windshield 12. The projected light is reflected in projection region 13 and is applied to a laterally-long region (eye box region) around eyes of driver 2. Predetermined image 30 is thus displayed as a virtual image in a visual field ahead of driver 2. Driver 2 can view image 30 as a virtual image superimposed on a scene ahead of windshield 12. In other words, image display device 20 forms image 30 as a virtual image in a space ahead of projection region 13 in windshield 12.

Figure 1C:
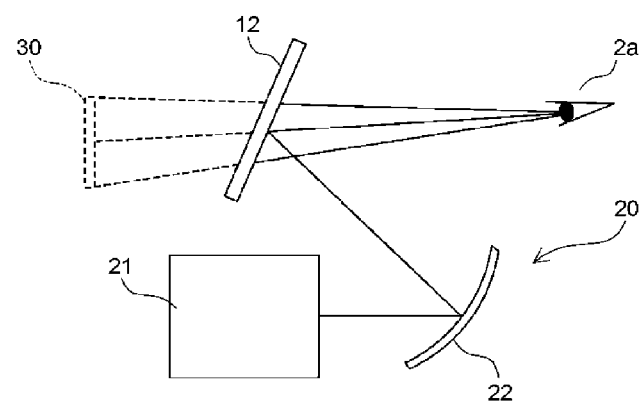
FIG. 1C is a schematic view depicting a configuration of the image display device according to the exemplary embodiment.

FIG. 1C is a schematic view depicting a configuration of image display device 20.

Image display device 20 includes irradiation light generator 21 and mirror 22. Irradiation light generator 21 emits light modulated in accordance with a video signal. Mirror 22 has a curved reflecting surface, and reflects the light emitted from irradiation light generator 21 toward windshield 12. The light reflected by windshield 12 is applied to eye 2a of driver 2. An optical system of irradiation light generator 21 and mirror 22 are designed to display, ahead of windshield 12, image 30 as a virtual image having predetermined size.

Mirror 22 configures an optical system for generation of a virtual image from light from screen 108 to be described later. This optical system is not necessarily configured only by mirror 22. This optical system may include a plurality of mirrors, lenses, or the like.

Figure 2:
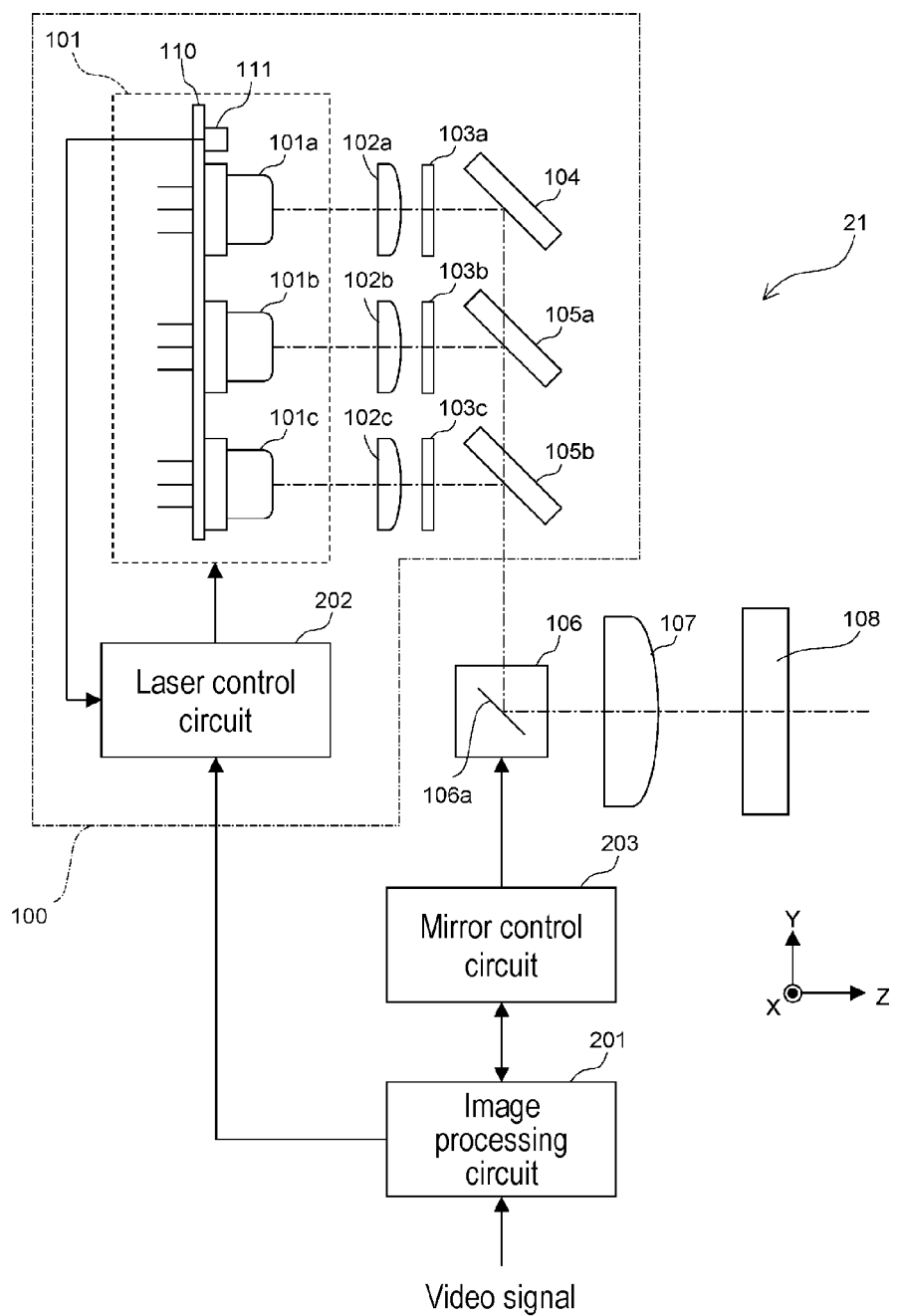
FIG. 2 is a block diagram of an irradiation light generator and a circuit included in the irradiation light generator in the image display device according to the exemplary embodiment.

FIG. 2 is a block diagram of irradiation light generator 21 and a circuit included in irradiation light generator 21 in image display device 20.

Irradiation light generator 21 includes light source 101, collimator lenses 102a to 102c, apertures 103a to 103c, mirror 104, dichroic mirrors 105a, 105b, scanning unit 106, correction lens 107, and screen 108.

Light source 101 includes three laser light sources 101a, 101b, 101c.

Laser light source 101a emits laser light having a red wavelength in a range from 635 nm to 645 nm inclusive, laser light source 101b emits laser light having a green wavelength in a range from 510 nm to 530 nm inclusive, and laser light source 101c emits laser light having a blue wavelength in a range from 440 nm to 460 nm inclusive. Light source 101 according to the present exemplary embodiment includes three laser light sources 101a, 101b, 101c to display image 30 in multiple colors. Laser light sources 101a, 101b, 101c are each configured by a semiconductor laser or the like. When a monochromatic image is displayed as image 30, light source 101 may include only one laser light source corresponding to a color of the image. Light source 101 may alternatively include two laser light sources having different wavelengths of emitted light.

Laser light sources 101a, 101b, 101c emit laser light beams converted to parallel light beams by collimator lenses 102a to 102c, respectively. The laser light beams transmitted through collimator lenses 102a to 102c are shaped to circular beams having substantially same size by apertures 103a to 103c, respectively. Apertures 103a to 103c configure a beam shaper for alignment in size and shape of the laser light beams emitted from laser light sources 101a, 101b, 101c, respectively.

Collimator lenses 102a to 102c can each be replaced with a shaping lens configured to shape laser light to have a circular beam shape and collimate the laser light. Apertures 103a to 103c may not be provided in this case.

The laser light beams in the respective colors emitted from laser light sources 101a, 101b, 101c are then optical-axially aligned by mirror 104 and two dichroic mirrors 105a, 105b. Mirror 104 substantially totally reflects the red laser light transmitted through collimator lens 102a. Dichroic mirror 105a reflects the green laser light transmitted through collimator lens 102b, and transmits the red laser light reflected by mirror 104. Dichroic mirror 105b reflects the blue laser light transmitted through collimator lens 102c, and transmits the red laser light and the green laser light having reached dichroic mirror 105b via dichroic mirror 105a. Mirror 104 and two dichroic mirrors 105a, 105b are disposed to optical-axially align laser light beams in the respective colors emitted from laser light sources 101a, 101b, 101c.

Scanning unit 106 reflects the laser light beams in the respective colors having reached scanning unit 106 via dichroic mirror 105b. Scanning unit 106 is configured by a micro electro mechanical system (MEMS) mirror or the like, and is configured to rotate mirror 106a, to which the laser light beams in the respective colors enter via dichroic mirror 105b, about an axis parallel to the X axis and an axis perpendicular to the X axis and parallel to a reflecting surface of mirror 106a, in accordance with a driving signal. Mirror 106a rotated in this manner changes a reflection direction of laser light in a direction parallel to an X-Z plane and a direction parallel to a Y-Z plane. Screen 108 is thus scanned two-dimensionally by the laser light beams in the respective colors as to be described later.

Scanning unit 106 is configured by the MEMS mirror of a two-axis driving system herein, but may optionally be configured differently. Scanning unit 106 may exemplarily include two combined mirrors rotated respectively about two axes perpendicular to each other.

Correction lens 107 is designed to direct laser light beams in respective colors in a positive direction along the Z axis regardless of a swing angle of laser light by scanning unit 106. Correction lens 107 includes a plurality of combined lenses or the like.

Screen 108 is configured to cause an image to be formed by laser light scanning, and diffuse incident laser light in a region (eye box region) around eye 2a of driver 2. Screen 108 can include a microlens array, a diffuser panel, and the like. Screen 108 can be made of a transparent resin such as polyethylene terephthalate (PET).

As to be described later, screen 108 according to the present exemplary embodiment has an incidence surface provided with lens units configured to diffuse laser light along the X axis, and an emission surface provided with lens units configured to diffuse laser light along the Y axis. Screen 108 will be described later in terms of a configuration with reference to FIG. 3A.

Image processing circuit 201 includes an arithmetic processing unit such as a central processing unit (CPU) and a memory, and is configured to process an input video signal and control laser control circuit 202 and mirror control circuit 203.

Laser control circuit 202 changes emission intensity of laser light sources 101a, 101b, 101c in accordance with a gradation signal for a corresponding color received from image processing circuit 201. Laser control circuit 202 also adjusts luminance and white balance of laser light sources 101a, 101b, 101c in accordance with temperature detected by temperature sensor 111. Control executed by laser control circuit 202 will be described later with reference to FIG. 10.

Mirror control circuit 203 drives mirror 106a of scanning unit 106 in accordance with a control signal from image processing circuit 201. Control of scanning unit 106 during image display operation will be described later with reference to FIG. 3B.

As depicted in FIG. 2, laser light sources 101a, 101b, 101c are disposed on single circuit board 110. Circuit board 110 is further provided with temperature sensor 111 configured to detect temperature around laser light sources 101a, 101b, 101c. Temperature sensor 111 is placed around laser light source 101a configured to emit laser light having the red wavelength. In other words, temperature sensor 111 is disposed closer to laser light source 101a than two remaining laser light sources 101b, 101c. Alternatively, laser light sources 101a, 101b, 101c can each be provided with a dedicated temperature sensor.

The present exemplary embodiment provides light source device 100 including laser light sources 101a, 101b, 101c, collimator lens 102a, 102b, 102c, apertures 103a, 103b, 103c, mirror 104, dichroic mirrors 105a, 105b, circuit board 110, temperature sensor 111, and laser control circuit 202. Light source device 100 optionally includes any additional configuration. Light source device 100 can be configured independently as a single unit.

Figure 3A:
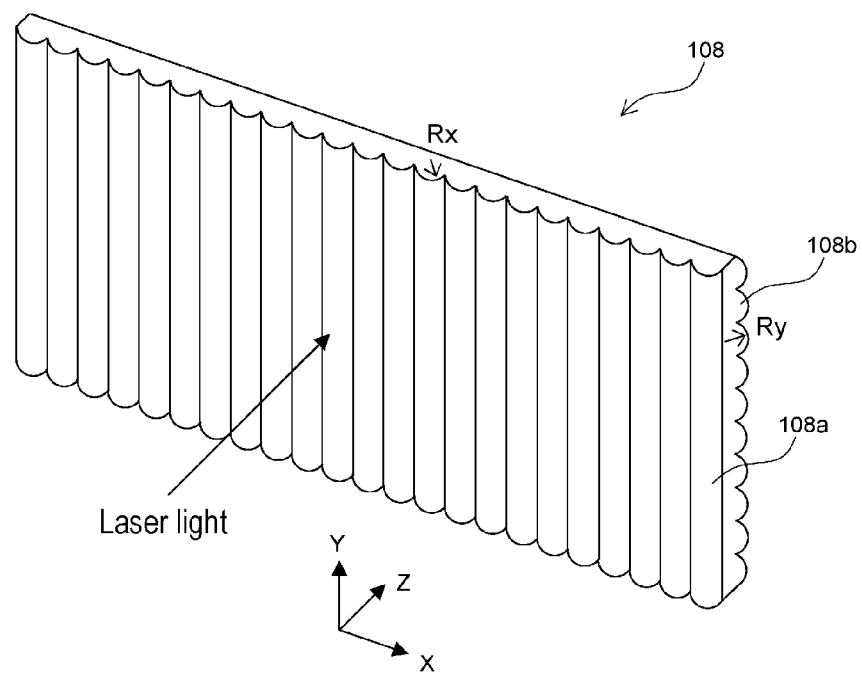
FIG. 3A is a schematic perspective view depicting a state of laser light incident on a screen according to the exemplary embodiment.

FIG. 3A is a schematic perspective view depicting the configuration of screen 108.

As depicted in FIG. 3A, screen 108 has a laser light incidence surface provided with a plurality of first lens units 108a configured to spread laser light along the X axis and arrayed along the X axis at constant pitches. First lens units 108a extend in parallel with each other along the Y axis. First lens units 108a each have a substantially circular arc shape as viewed along the Y axis. First lens units 108a are 50 μm or the like in width along the X axis (the pitches of first lens units 108a).

Screen 108 has a laser light emission surface provided with a plurality of second lens units 108b configured to spread laser light along the Y axis and arrayed along the Y axis at constant pitches. Second lens units 108b extend in parallel with each other along the Y axis. Second lens units 108b each have a substantially circular arc shape as viewed along the X axis. Second lens units 108b are 70 μm or the like in width along the Y axis (the pitches of second lens units 108b). The width along the Y axis of second lens units 108b may be equal to the width along the X axis of first lens units 108a.

First lens units 108a have curvature radius Rx different from curvature radius Ry of second lens units 108b. Curvature radius Rx is set smaller than curvature radius Ry. Each of first lens units 108a converges and then spreads laser light to have a first divergence angle, and each of second lens units 108b converges and then spreads laser light to have a second divergence angle. The first divergence angle is thus larger than the second divergence angle. The curvature of first lens units 108a and the curvature of second lens units 108b are set as described above, to guide laser light transmitted through screen 108 to the laterally-long region (eye box region) around eye 2a of driver 2. The curvature radii of first lens units 108a and second lens units 108b are determined in accordance with the shape of the eye box region.

Figure 3B:
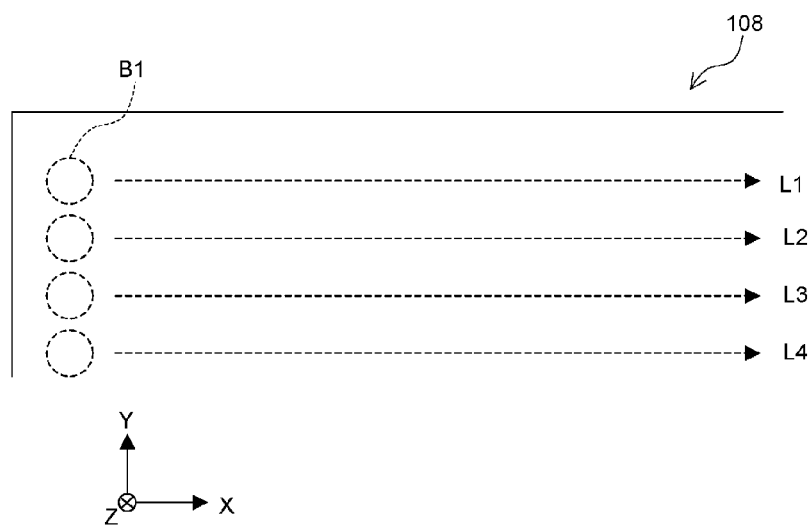
FIG. 3B is a schematic view depicting relation between the screen and scanning lines according to the exemplary embodiment.

FIG. 3B is a schematic view depicting relation between screen 108 and scanning lines.

The incidence surface (surface on a negative side of the Z axis) of screen 108 configured as described above is scanned by beams B1 obtained by aligning the laser light beams in the respective colors. The incidence surface of screen 108 is preliminarily provided with scanning lines L1 to Ln for beams B1 at constant intervals along the Y axis. Scanning lines L1 to Ln have start positions matching on the X axis and end positions matching on the X axis. Beams B1 have a diameter set smaller than the width of second lens units 108b. The diameter of beams B1 is exemplarily set to approximately 35 μm to 65 μm. In the present exemplary embodiment, the diameter of beams B1 is set smaller than the width of second lens units 108b as well as the width of first lens units 108a.

Beams B1 scan scanning lines L1 to Ln thus set sequentially from a positive side of the Y axis. Screen 108 is two-dimensionally scanned by beams B1 to allow an image to be drawn on screen 108. Scanning lines L1 to Ln are scanned in a cycle of 1/60 seconds or the like.

Emission intensity of laser light sources 101a, 101b, 101c is controlled in accordance with a video signal at each scan position on scanning lines L1 to Ln. Specifically, laser light sources 101a, 101b, 101c each have driving current controlled in accordance with the video signal to control intensity of each of the laser light beams having the different wavelengths at each scan position. The image according to the video signal is thus drawn on screen 108. The driving current is generated by driver unit 210 (see FIG. 4A) provided in laser control circuit 202 and is supplied to a corresponding one of laser light sources 101a, 101b, 101c.

Figure 4A:
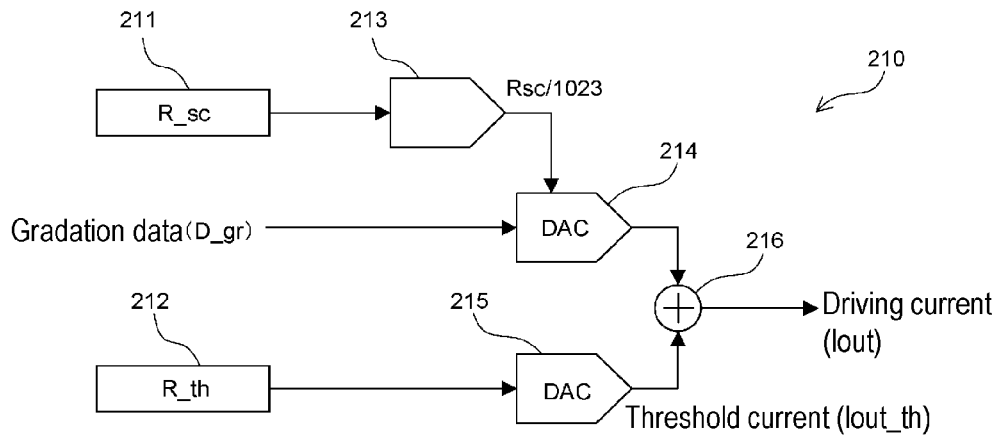
FIG. 4A is a block diagram of a driver unit included in a laser control circuit according to the exemplary embodiment.

FIG. 4A is a block diagram of driver unit 210.

As described above, driver unit 210 is provided inside laser control circuit 202. Driver unit 210 is provided individually to laser light source 101a, 101b, 101c.

As depicted in FIG. 4A, driver unit 210 includes resistors 211, 212, arithmetic circuit 213, color digital-to-analog converter (DAC) 214, threshold DAC 215, and adder 216. Driver unit 210 is configured to generate driving current (Iout) in accordance with the following expression.

$$\text{Iout\_th} = \text{Ith\_max} \times \frac{\text{R\_th}}{255} \quad (1)$$

$$\text{Iout} = \text{I\_max} \times \frac{\text{D\_gr}}{1023} \times \frac{\text{R\_sc}}{1023} + \text{Iout\_th} \quad (2)$$

Resistor 212 has set resistor value (R_th) included in expression (1). Resistor 211 has set resistor value (R_sc) included in expression (2). Resistor value (R_th) is eight-bit data, whereas resistor value (R_sc) is ten-bit data. Accordingly, resistor value (R_th) has a data range from 0 to 255, whereas resistor value (R_sc) has a data range from 0 to 1023.

Driver unit 210 has preset maximum threshold current (Ith_max) and preset maximum current (I_max). Maximum threshold current (Ith_max) is exemplarily set to about 220 mA, whereas maximum current (I_max) is exemplarily set to about 300 mA to 460 mA. Gradation data (D_gr) is a gradation value of a video signal for each color. Gradation data (D_gr) is ten-bit data and has a data range from 0 to 1023.

As in expression (1), threshold current (Iout_th) is obtained by multiplying maximum threshold current (Ith_max) and ratio (R_th/255) of resistor value (R_th). This arithmetic operation is executed by threshold DAC 215. Threshold DAC 215 converts a digital value obtained by the arithmetic operation according to expression (1) to an analog signal and outputs threshold current (Iout_th).

As in expression (2), maximum value of current variation width (I_max·R_sc/1023) is obtained by multiplying maximum current (I_max) and ratio (R_sc/1023) of resistor value (R_sc). Ratio (R_sc/1023) is calculated by arithmetic circuit 213. Furthermore, a current value according to the gradation of the video signal is obtained by multiplying maximum value of current variation width (I_max·R_sc/1023) and ratio (D_gr/1023) of gradation data (D_gr). This arithmetic operation is executed by color DAC 214. Color DAC 214 converts a digital value obtained by this arithmetic operation to an analog signal and outputs current according to the gradation of the video signal.

Adder 216 adds threshold current (Iout_th) output from threshold DAC 215 to the current according to the gradation of the video signal output from color DAC 214. The arithmetic operation according to expression (2) is thus executed to generate driving current (Iout).

Figure 4B:
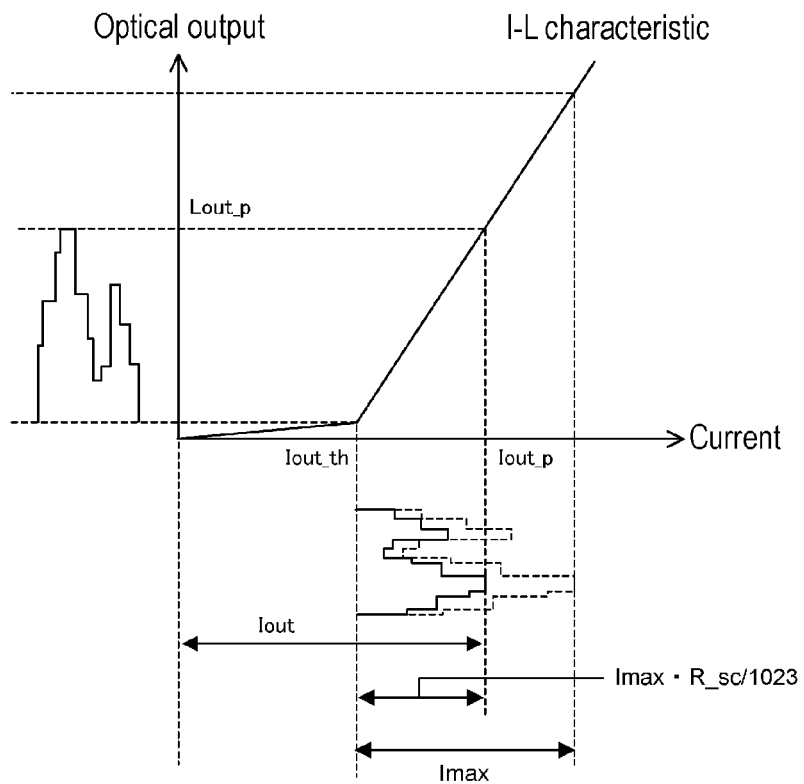
FIG. 4B is a schematic graph indicating an output characteristic (I-L characteristic) of a laser light source according to the exemplary embodiment.

FIG. 4B is a schematic graph indicating an output characteristic (I-L characteristic) of laser light sources 101a, 101b, 101c.

FIG. 4B includes a transverse axis indicating driving current applied to laser light sources 101a, 101b, 101c, and an ordinate axis indicating light intensity of light emitted from light source device 100. Driving current according to a video signal is schematically indicated (by a solid line) below the transverse axis, whereas optical output upon application of this driving current is schematically indicated on the left of the ordinate axis. There is provided, below the transverse axis, a broken line indicating driving current according to the video signal in a case where resistor value (R_sc) has maximum value (1023).

As indicated in FIG. 4B, laser light sources 101a, 101b, 101c execute laser oscillation to emit laser light when current equal to or more than threshold current (Iout_th) is applied to laser light sources 101a, 101b, 101c. Threshold current (Iout_th) has a minimum value of driving current required for laser oscillation. Optical output changes substantially linearly in accordance with change in driving current that is equal to or more than the threshold current. Such a range has substantially constant slope efficiency.

Resistor value (R_th) in expression (1) is set such that threshold current (Iout_th) matches the threshold current in the I-L characteristic of laser light sources 101a, 101b, 101c. Specifically, laser control circuit 202 substitutes a value of the threshold current in the I-L characteristic of laser light sources 101a, 101b, 101c for threshold current (Iout_th) in expression (1) to invertedly calculate resistor value (R_th) that is set at resistor 212.

Resistor value (R_sc) in expression (2) is set in accordance with maximum value (Lout_p) of optical output set for light having each wavelength through white balance adjustment. Resistor value (R_sc) is set such that maximum value (Iout_p) of driving current (Iout) matches a value of driving current corresponding to maximum value (Lout_p) of optical output according to the white balance adjustment. Specifically, laser control circuit 202 obtains the maximum value of driving current corresponding to maximum value (Lout_p) of optical output in accordance with the I-L characteristic of laser light sources 101a, 101b, 101c. Laser control circuit 202 then substitutes the obtained maximum value of driving current for driving current (Iout) in expression (2), substitutes maximum value (1023) for gradation data (D_gr), and substitutes the value of the threshold current similar to the threshold current substituted in expression (1) for threshold current (Iout_th), to invertedly calculate resistor value (R_sc) that is set at resistor 211.

Resistor value (R_th) is set at resistor 212 and resistor value (R_sc) is set at resistor 211, so that light having each wavelength is outputted to achieve a display color according to the white balance. An image according to the video signal is thus displayed as a virtual image.

The I-L characteristic of laser light sources 101a, 101b, 101c changes in accordance with temperature change around laser light sources 101a, 101b, 101c. When temperature around laser light source 101a, 101b, 101c changes, threshold current (Iout_th) changes and the I-L characteristic has inclination (slope efficiency) changing in a temperature range for current equal to or more than threshold current (Iout_th). Resistor value (R_th) and resistor value (R_sc) thus need to be adjusted in accordance with temperature change.

The present exemplary embodiment thus includes approximating, with use of approximate expressions, change in threshold current (Iout_th) and change in slope efficiency of laser light sources 101a, 101b, 101c relative to temperature, to obtain, with use of the approximate expressions, threshold current (Iout_th) and slope efficiency of laser light sources 101a, 101b, 101c corresponding to detection temperature of temperature sensor 111. Resistor value (R_th) and resistor value (R_sc) are then updated in accordance with threshold current (Iout_th) and the slope efficiency thus obtained.

The inventors have discovered that, for laser light source 101a configured to emit laser light having a wavelength in the range from 635 nm to 645 nm inclusive, change in threshold current (Iout_th) relative to temperature can be approximated with use of a quartic expression and change in slope efficiency relative to temperature can be approximated with use of a quadratic expression. The inventors have further discovered that, for each of laser light source 101b configured to emit laser light having a wavelength in the range from 510 nm to 530 nm inclusive and laser light source 101c configured to emit laser light having a wavelength in the range from 440 nm to 460 nm inclusive, change in threshold current (Iout_th) relative to temperature can be approximated with use of a linear expression and change in slope efficiency relative to temperature can be approximated with use of a linear expression. Resistor value (R_th) and resistor value (R_sc) can thus be adjusted appropriately by applying these approximate expressions thus discovered to each of the laser light sources.

Described below are tests of these approximate expressions and adjustment of resistor value (R_th) and resistor value (R_sc) with use of these approximate expressions.

<Test 1>

Figure 5:
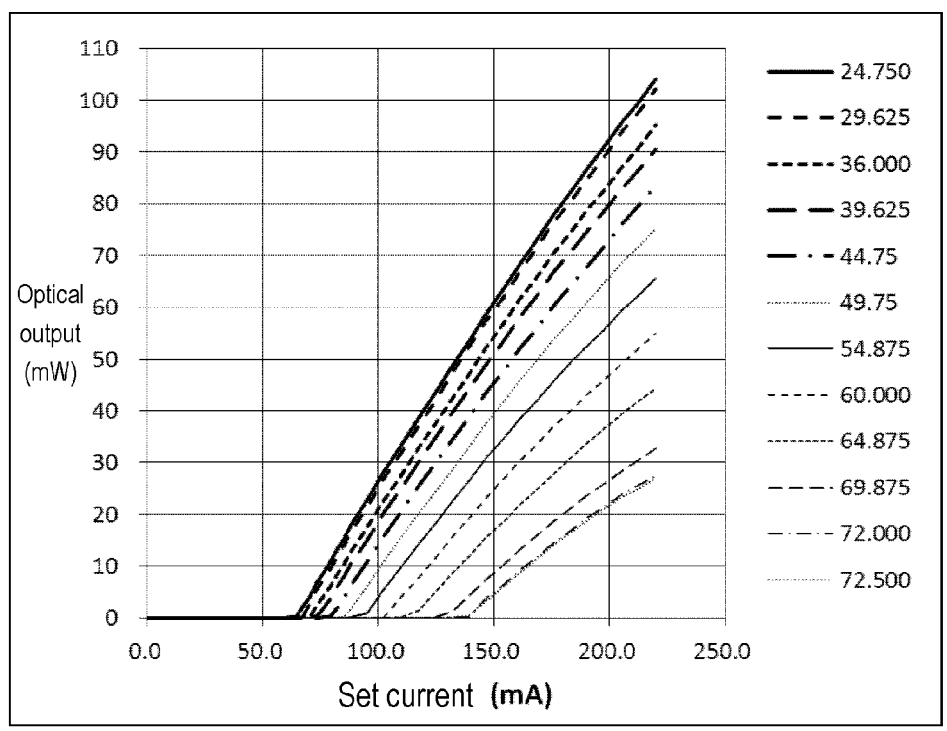
FIG. 5 is a graph specifically exemplifying an I-L characteristic of a laser light source configured to emit laser light having a wavelength of 638 nm according to the exemplary embodiment.

FIG. 5 is a graph specifically exemplifying the I-L characteristic of laser light source 101a (semiconductor laser) configured to emit laser light having a wavelength of 638 nm.

FIG. 5 indicates the I-L characteristic at temperature around laser light source 101a changed by twelve levels from 24.750° C. to 72.500° C. FIG. 5 includes a transverse axis indicating current applied to laser light source 101a and an ordinate axis indicating intensity of laser light emitted from light source device 100. Found from FIG. 5 is that threshold current (Iout_th) and slope efficiency in the I-L characteristic change in accordance with temperature change.

Figure 6A:
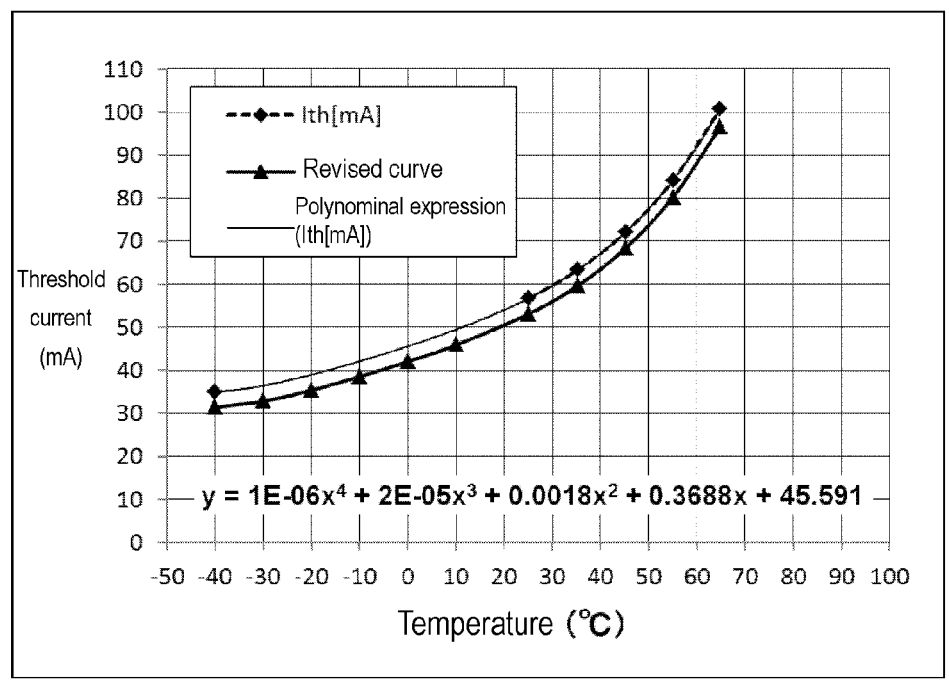
FIG. 6A is a graph indicating an approximate curve of threshold current of the laser light source configured to emit laser light having the wavelength of 638 nm according to the exemplary embodiment.

FIG. 6A is a graph indicating an approximate curve of threshold current for laser light source 101a (semiconductor laser) configured to emit laser light having the wavelength of 638 nm.

FIG. 6A includes a transverse axis indicating temperature around laser light source 101a and an ordinate axis indicating threshold current (Iout_th).

FIG. 6A includes rhombic plots indicating actually measured values of threshold current (Iout_th). Set in the test are six temperature values of −40° C., 25° C., 35° C., 45° C., 55° C., and 65° C. as the temperature around laser light source 101a.

When the temperature around laser light source 101a has the values of 25° C., 35° C., 45° C., 55° C., and 65° C., threshold current (Iout_th) has an approximate curve according to the actually measured values, and the approximate curve seems to be obtained through approximation with use of a quadratic expression. However, when threshold current (Iout_th) is measured at the temperature around laser light source 101a being set to −40° C., threshold current (Iout_th) has an actually measured value largely departing from the approximate curve obtained at the five temperature values and through approximation with use of the quadratic expression. The inventors have then obtained an approximate curve from six actually measured values including the actually measured value at −40° C. This approximate curve has a curve (polynomial expression) that is drawn by a solid line in FIG. 6A and can be expressed by a quartic expression (expression (3) provided below) added to the graph of FIG. 6A. The quartic expression includes "x" indicating temperature and "y" indicating threshold current (Iout_th).

$$y=1\times10^{-6}x^4+2\times10^{-5}x^3+0.0018x^2+0.3688x+45.591 \tag{3}$$

The quartic expression in FIG. 6A includes "E" representing exponentiation of ten. For example, "1E−6" represents $1\times10^{-6}$.

Found through the present test is that, for laser light source 101a (semiconductor laser) configured to emit laser light having the wavelength of 638 nm, change in threshold current (Iout_th) relative to temperature can be approximated with use of the quartic expression.

The inventors have examined to find that the curve of the quartic expression indicating change in threshold current (Iout_th) is slightly shifted vertically in FIG. 6A by individual difference among products or the like even for laser light sources 101a (semiconductor laser) of the same product type. FIG. 6A includes triangle plots and an approximate curve of the plots exemplifying the case where the approximate curve of the quartic expression is shifted vertically by the individual difference. The inventors have found that the shift can be handled by adjusting a constant term ("45.591" in expression (3) in exemplification of FIG. 6A) in the quartic expression. Specifically, to handle such a case where an approximate curve of a quartic expression is deviated by individual difference or the like, a constant term in the quartic expression has only to be adjusted such that threshold current at each temperature level is located on the approximate curve of the quartic expression.

Figure 6B:
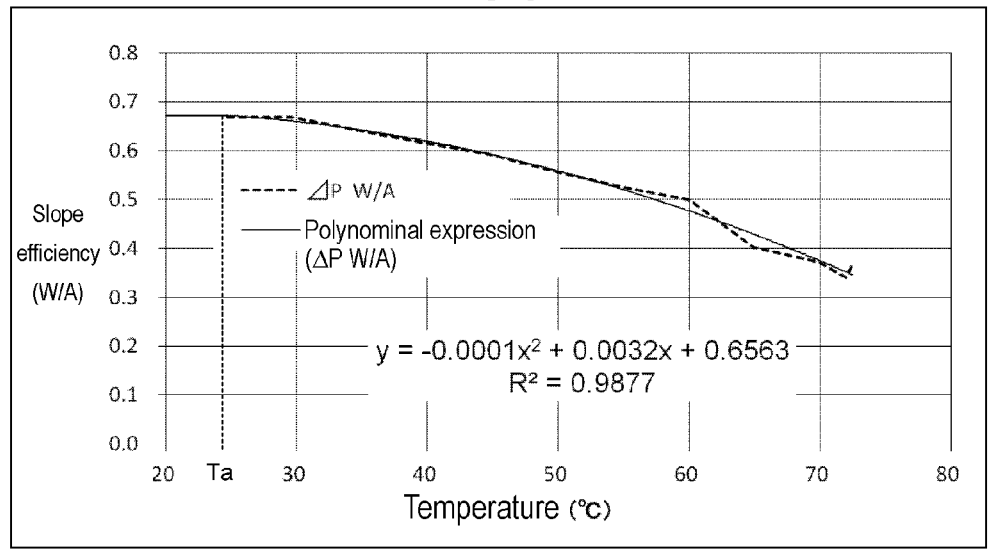
FIG. 6B is a graph indicating an approximate curve of slope efficiency of the laser light source configured to emit laser light having the wavelength of 638 nm according to the exemplary embodiment.

FIG. 6B is a graph indicating an approximate curve of slope efficiency of laser light source 101a (semiconductor laser) configured to emit laser light having the wavelength of 638 nm.

The slope efficiency (inclination of the I-L characteristic) in FIG. 6B is obtained in accordance with optical output at a current value immediately after exceeding threshold current and optical output at a current maximum value during measurement at each temperature level. FIG. 6B includes a broken line indicating actually measured values of the slope efficiency, and a solid line indicating the approximate curve according to the actually measured values.

This approximate curve can be expressed by a quadratic expression (expression (4)) added to the graph of FIG. 6B. The quadratic expression includes "x" indicating temperature and "y" indicating slope efficiency.

$$y=-0.0001x^2+0.0032x+0.6563 \tag{4}$$

FIG. 6B includes "$R^2$" (=0.9877) indicating a matching rate between the actually measured values and the approximate curve (quadratic expression). The inventors have found that, similarly to threshold current, shift caused by individual difference among laser light sources 101a (semiconductor lasers), of a quadratic curve obtained by approximation of slope efficiency can be handled by adjusting a constant term in a quadratic expression.

The inventors have examined to find that, when temperature around laser light source 101a is in a range of temperature equal to or less than temperature Ta (25° C. herein) around normal temperature, slope efficiency is kept at a level of temperature Ta. The slope efficiency obtained at temperature Ta with use of the quadratic expression can thus simply be regarded as the slope efficiency in the range of temperature equal to or less than temperature Ta. Temperature Ta needs to be set to a level at which slope efficiency has a predetermined value.

Laser light source 101a (semiconductor laser) configured to emit laser light having the wavelength of 638 nm is tested as described above. At least a laser light source configured to emit laser light having a wavelength in the range from 635 nm to 645 nm inclusive can be estimated to have similar tendency to laser light source 101a thus tested. For laser light source 101a configured to emit laser light having a wavelength in the range from 635 nm to 645 nm inclusive, change in threshold current (Iout_th) relative to temperature can be approximated with use of a quartic expression, and change in slope efficiency relative to temperature can be approximated with use of a quadratic expression. The quartic expression and the quadratic expression each include coefficient terms and a constant term that need to be corrected appropriately in accordance with the wavelength of emitted light and the type of the product.

When a laser light source configured to emit light having a wavelength slightly deviating from the range from 635 nm to 645 nm inclusive is applied as laser light source 101a configured to emit light in a red wavelength band and has change in threshold current (Iout_th) and change in slope efficiency at this emitted light wavelength similar in tendency to the changes in the above test, the change in threshold current (Iout_th) relative to temperature can be approximated with use of a quartic expression and the change in slope efficiency relative to temperature can be approximated with use of a quadratic expression to obtain threshold current (Iout_th) and slope efficiency at each temperature level.

<Test 2>

Figure 7A:
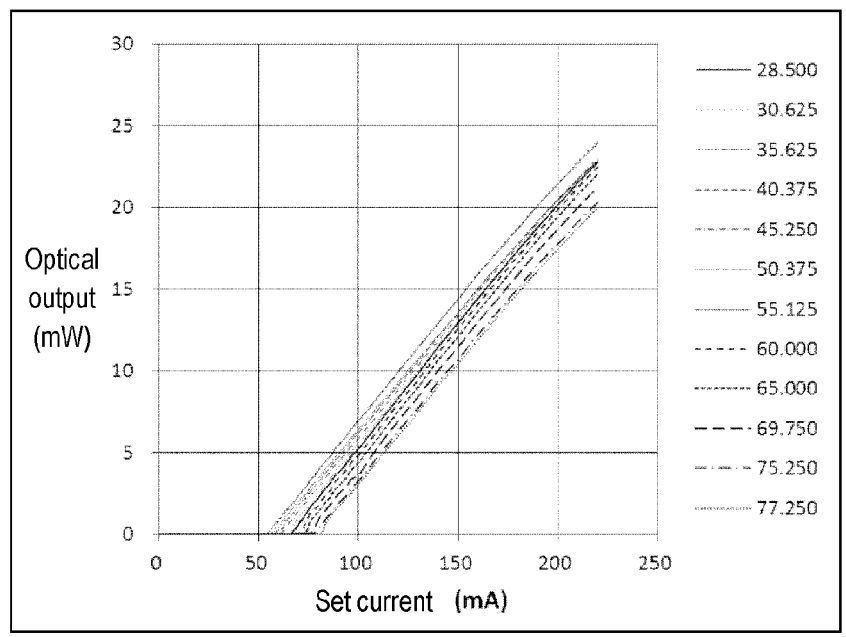
FIG. 7A is a graph specifically exemplifying an I-L characteristic of a laser light source configured to emit laser light having a wavelength of 520 nm according to the exemplary embodiment.
Figure 7B:
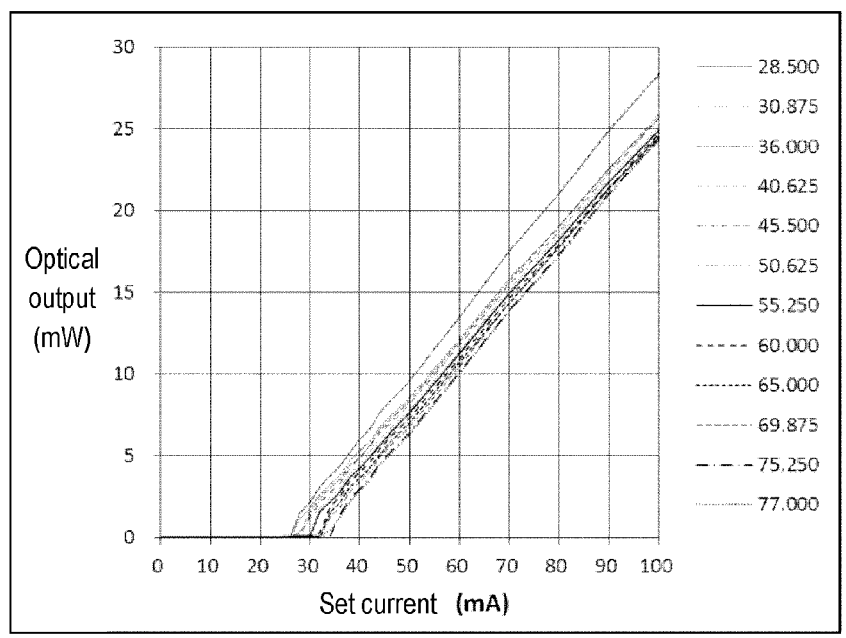
FIG. 7B is a graph specifically exemplifying an I-L characteristic of a laser light source configured to emit laser light having a wavelength of 450 nm according to the exemplary embodiment.

FIG. 7A is a graph specifically exemplifying the I-L characteristic of laser light source 101b configured to emit laser light having a wavelength of 520 nm, and FIG. 7B is a graph specifically exemplifying the I-L characteristic of laser light source 101c configured to emit laser light having a wavelength of 450 nm.

FIG. 7A indicates the I-L characteristic obtained when temperature around laser light source 101b is changed by twelve levels from 28.500° C. to 77.250° C., whereas FIG. 7B indicates the I-L characteristic obtained when temperature around laser light source 101c is changed by twelve levels from 28.500° C. to 77.000° C. Both graph includes a transverse axis indicating current applied to laser light source 101b or 101c and an ordinate axis indicating intensity of laser light emitted from light source device 100. Found from FIG. 7A and FIG. 7B is that threshold current (Iout_th) and slope efficiency in the I-L characteristic change in accordance with temperature change.

Figure 8A:
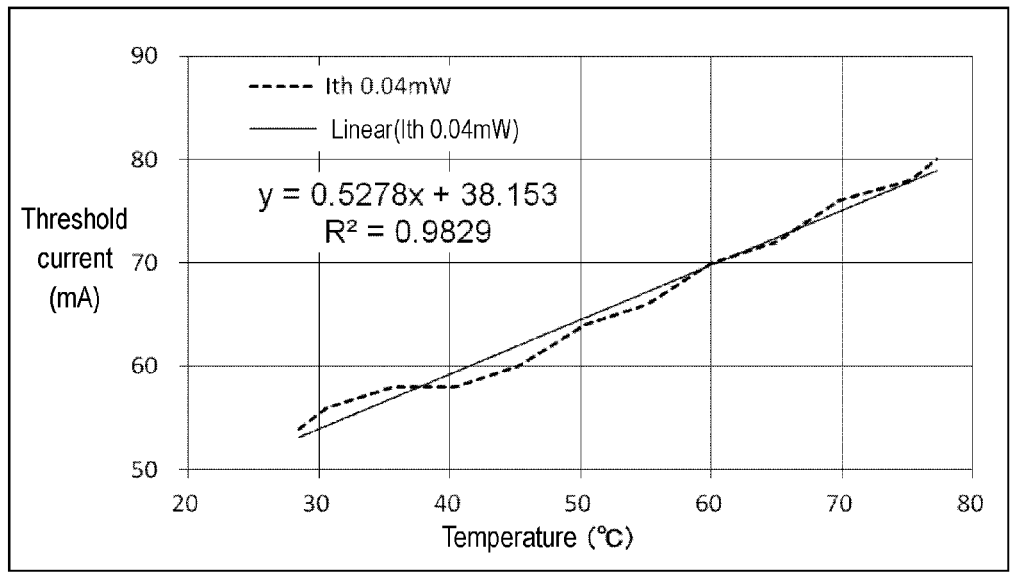
FIG. 8A is a graph indicating an approximate straight line of threshold current of the laser light source configured to emit laser light having the wavelength of 520 nm according to the exemplary embodiment.
Figure 8B:
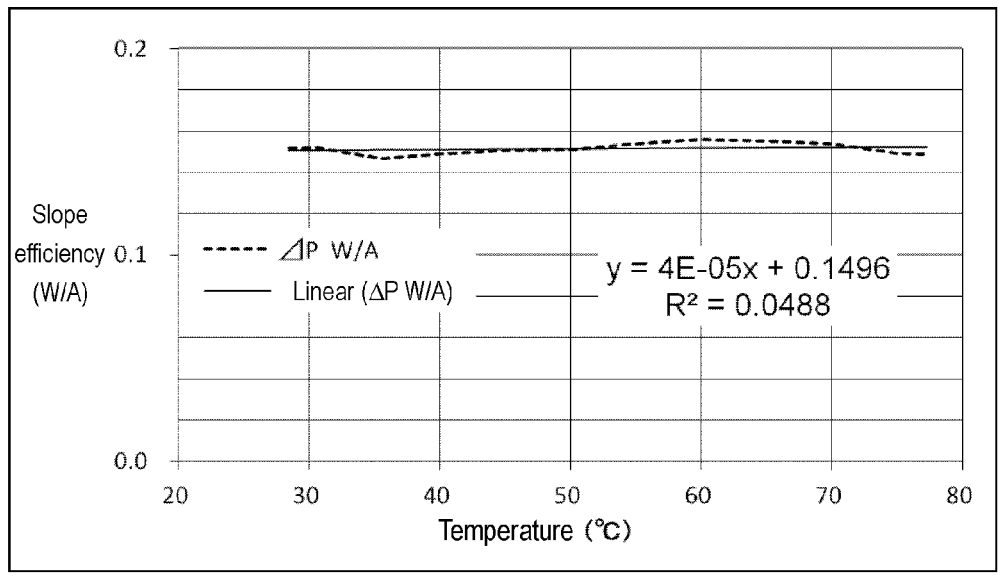
FIG. 8B is a graph indicating an approximate straight line of slope efficiency of the laser light source configured to emit laser light having the wavelength of 520 nm according to the exemplary embodiment.

FIG. 8A is a graph indicating an approximate straight line of threshold current for laser light source 101b (semiconductor laser) configured to emit laser light having the wavelength of 520 nm, whereas FIG. 8B is a graph indicating an approximate straight line of slope efficiency for laser light source 101b (semiconductor laser) configured to emit laser light having the wavelength of 520 nm.

FIG. 8A and FIG. 8B include broken lines indicating actually measured values of threshold current (Iout_th) and the slope efficiency, respectively, and solid lines indicating the approximate straight lines according to the actually measured values. The slope efficiency (inclination of the I-L characteristic) indicated in FIG. 8B is obtained in a manner similar to the manner for the slope efficiency in FIG. 6B.

The approximate straight line of threshold current (Iout_th) can be expressed by a linear expression (expression (5)) added to the graph of FIG. 8A. The linear expression includes "x" indicating temperature and "y" indicating threshold current (Iout_th).

$$y=0.5278x+38.153 \quad (5)$$

In this case, $R^2$ is equal to 0.9829.

The approximate straight line of the slope efficiency can be expressed by a linear expression (expression (6)) added to the graph of FIG. 8B. The linear expression includes "x" indicating temperature and "y" indicating slope efficiency.

$$y=4\times10^{-5}x+0.1496 \quad (6)$$

In this case, $R^2$ is equal to 0.0488. When $R^2=0.0488$ with a low matching rate, these lines have difference within 5% and can be regarded as having linear approximation. The expression in FIG. 8B includes "4E−05" representing $4\times10^{-5}$.

The inventors have found that shift of a linear straight line caused by individual difference among laser light sources 101b (semiconductor lasers) configured to emit laser light having the wavelength of 520 nm can be handled by adjusting a constant term in a linear expression of threshold current (Iout_th), as in the test 1. Similarly, the inventors have found that shift of a linear straight line caused by individual difference among laser light sources 101b (semiconductor lasers) can be handled by adjusting a constant term in a quadratic expression of slope efficiency.

Laser light source 101b (semiconductor laser) configured to emit laser light having the wavelength of 520 nm is tested as described above. At least another laser light source configured to emit laser light having a wavelength in the range from 510 nm to 530 nm inclusive can be estimated as being similar in tendency to laser light source 101b thus tested. For laser light source 101b configured to emit laser light having a wavelength in the range from 510 nm to 530 nm inclusive, change in threshold current (Iout_th) relative to temperature may be approximated with use of a linear expression, and change in slope efficiency relative to temperature may be approximated with use of a linear expression. These linear expressions each include a coefficient term and a constant term that need to be corrected appropriately in accordance with the wavelength of emitted light and the type of the product.

When a laser light source configured to emit light having a wavelength slightly deviating from the range from 510 nm to 530 nm inclusive is applied as laser light source 101b configured to emit light in a green wavelength band and has change in threshold current (Iout_th) and change in slope efficiency at this emitted light wavelength similar in tendency to the changes in the above test, the change in threshold current (Iout_th) relative to temperature can be approximated with use of a linear expression and the change in slope efficiency relative to temperature can be approximated with use of a linear expression to obtain threshold current (Iout_th) and slope efficiency at each temperature level.

Figure 9A:
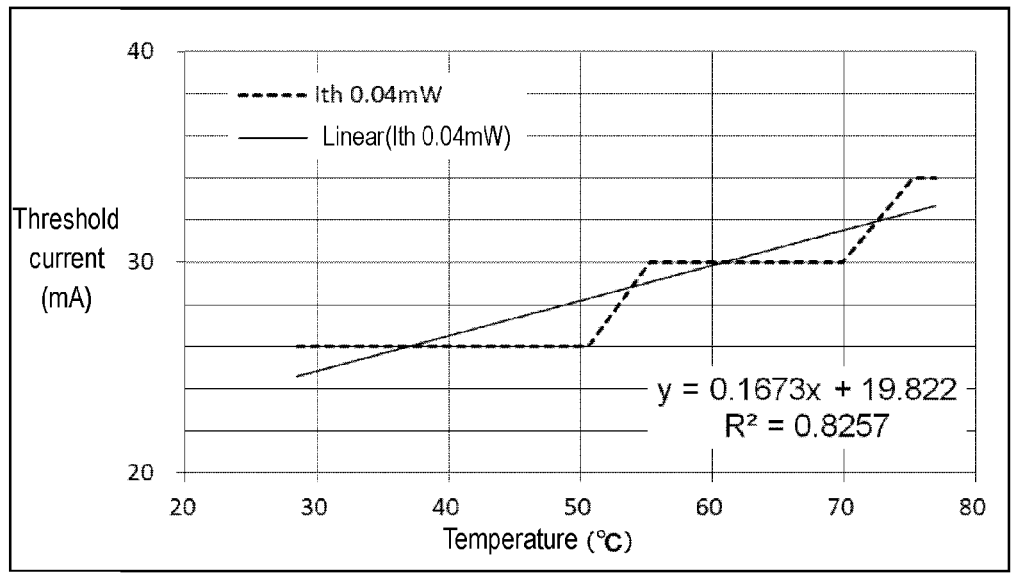
FIG. 9A is a graph indicating an approximate straight line of threshold current of the laser light source configured to emit laser light having the wavelength of 450 nm according to the exemplary embodiment.
Figure 9B:
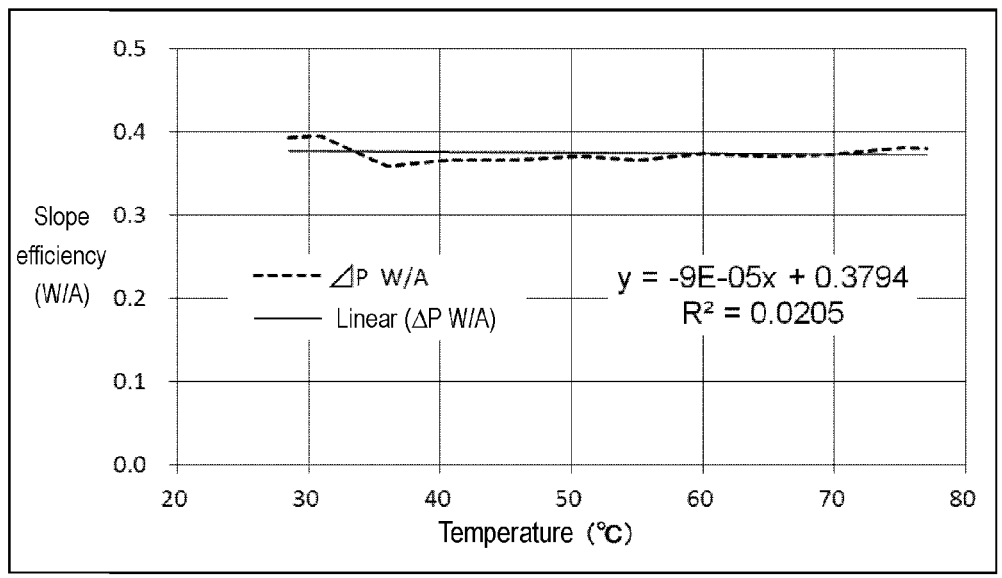
FIG. 9B is a graph indicating an approximate straight line of slope efficiency of the laser light source configured to emit laser light having the wavelength of 450 nm according to the exemplary embodiment.

FIG. 9A is a graph indicating an approximate straight line of threshold current for laser light source 101c (semiconductor laser) configured to emit laser light having the wavelength of 450 nm, whereas FIG. 9B is a graph indicating an approximate straight line of slope efficiency for laser light source 101c (semiconductor laser) configured to emit laser light having the wavelength of 450 nm.

FIG. 9A and FIG. 9B include broken lines indicating actually measured values of threshold current (Iout_th) and the slope efficiency, respectively, and solid lines indicating the approximate straight lines according to the actually measured values. The slope efficiency (inclination of the I-L characteristic) indicated in FIG. 9B is obtained in a manner similar to the manner for the slope efficiency in FIG. 6B.

The approximate straight line of threshold current (Iout_th) can be expressed roughly by a linear expression (expression (7)) added to the graph of FIG. 9A. The linear expression includes "x" indicating temperature and "y" indicating threshold current (Iout_th).

$$y=0.1673x+19.822 \quad (7)$$

In this case, $R^2$ is equal to 0.8257.

The approximate straight line of the slope efficiency can be expressed by a linear expression (expression (8)) added to the graph of FIG. 9B. The linear expression includes "x" indicating temperature and "y" indicating slope efficiency.

$$y=-9\times10^{-5}x+0.3794 \quad (8)$$

In this case, $R^2$ is equal to 0.0205. When $R^2=0.0205$ with a low matching rate, these lines have difference within 5% and can be regarded as having linear approximation. FIG. 9B includes "9E−05" representing $9\times10^{-5}$.

The inventors have found that shift of a linear straight line caused by individual difference among laser light sources 101c (semiconductor lasers) configured to emit laser light having the wavelength of 450 nm can be handled by adjusting a constant term in a linear expression of threshold current (Iout_th), as in the test 1. Similarly, the inventors have found that shift of a linear straight line caused by individual difference among laser light sources 101c (semiconductor lasers) can be handled by adjusting a constant term in a linear expression of slope efficiency.

Laser light source 101c (semiconductor laser) configured to emit laser light having the wavelength of 450 nm is tested as described above. At least another laser light source configured to emit laser light having a wavelength in the range from 440 nm to 460 nm inclusive can be estimated as being similar in tendency to laser light source 101c thus tested. For laser light source 101c configured to emit laser light having a wavelength in the range from 440 nm to 460 nm inclusive, change in threshold current (Iout_th) relative to temperature can be approximated with use of a linear expression, and change in slope efficiency relative to temperature can be approximated with use of a linear expression. These linear expressions each include a coefficient term and a constant term that need to be corrected appropriately in accordance with the wavelength of emitted light and the type of the product.

When a laser light source configured to emit light having a wavelength slightly deviating from the range from 440 nm to 460 nm inclusive is applied as laser light source 101c configured to emit light in a blue wavelength band and has change in threshold current (Iout_th) and change in slope efficiency at this emitted light wavelength similar in tendency to the changes in the above test, the change in threshold current (Iout_th) relative to temperature can be approximated with use of a linear expression and the change in slope efficiency relative to temperature can be approximated with use of a linear expression to obtain threshold current (Iout_th) and slope efficiency at each temperature level.

<Output Control>

Figure 10:
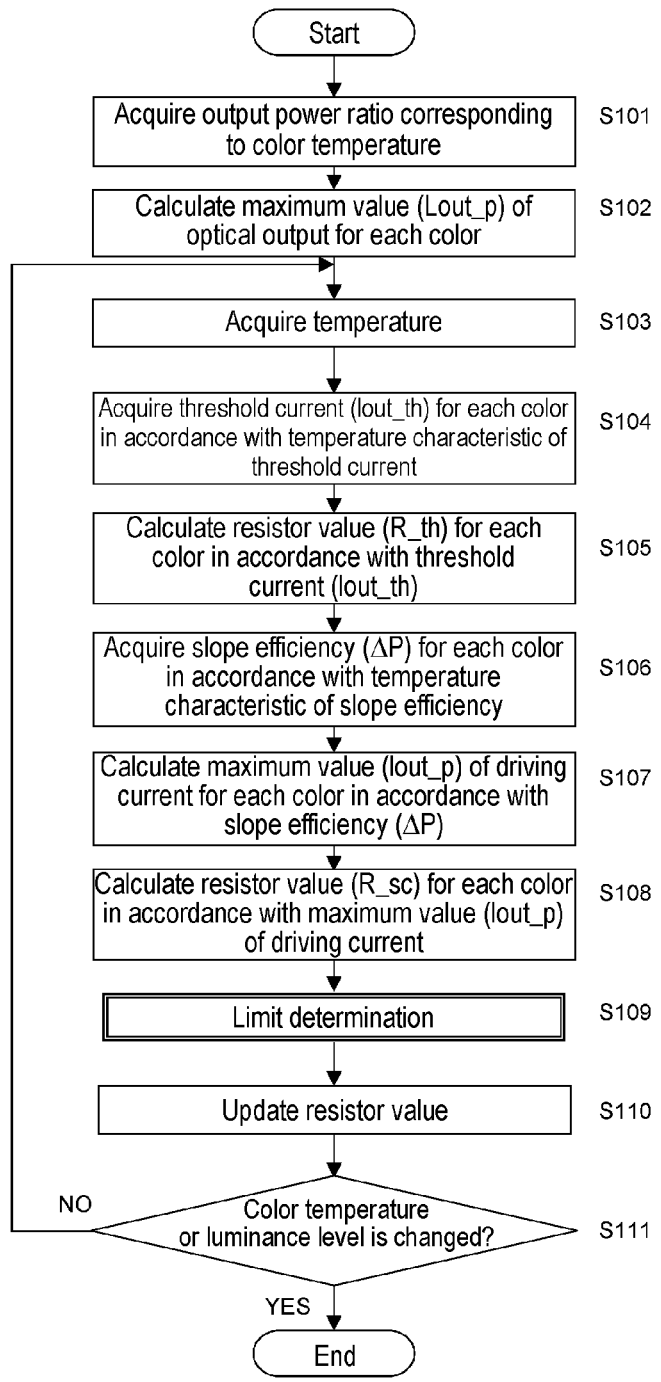
FIG. 10 is a flowchart depicting adjustment of luminance and white balance according to temperature change according to the exemplary embodiment.

FIG. 10 is a flowchart depicting adjustment of luminance and white balance according to temperature change according to the exemplary embodiment.

Processing of FIG. 10 is executed by laser control circuit 202 depicted in FIG. 2. Laser control circuit 202 includes driver unit 210 depicted in FIG. 4A, as well as a CPU and a memory, and is configured to execute the processing of FIG. 10 in accordance with a program stored in the memory. For execution of the processing of FIG. 10, the memory in laser control circuit 202 preliminarily stores a power ratio table of FIG. 11A and a luminance table of FIG. 11B.

The power ratio table of FIG. 11A includes color temperature and a distribution ratio of optical output of laser light having each wavelength, which are indicated in a corresponding manner. Optical output indicates light intensity corresponds to laser light having each wavelength and emitted from light source device 100 at a maximum gradation level. The color temperature corresponds to color temperature at an eye box. In the power ratio table, the color temperature at the eye box, and the distribution ratios of the laser light having each wavelength and emitted from light source device 100 are indicated in the corresponding manner. FIG. 11A exemplifies a case where the color temperature is switchable among three levels. Laser light sources 101a, 101b, 101c are estimated to emit laser light having the wavelengths of 638 nm, 520 nm, and 450 nm, respectively.

The luminance table of FIG. 11B includes each luminance level, magnification, and white balance correction values for light beams having red and blue wavelengths. The luminance table is referred to for changing brightness (luminance) of a display image. Specifically, the image is displayed at a high luminance level when the periphery is bright like during daytime on a fine day, and the image is displayed at a low luminance level when the periphery is dark like during nighttime. FIG. 11B exemplifies a case where the luminance is switchable among nine levels. Each of the luminance levels has magnification set correspondingly.

The magnification is applied for adjustment of maximum value (Lout_p) of optical output indicated in FIG. 4B. Maximum value (Lout_p) of optical output at each wavelength is calculated in accordance with the distribution ratios set in the power ratio table. Maximum value (Lout_p) is multiplied by magnification for adjustment of maximum value (Lout_p) of optical output at each wavelength. The display image is thus adjusted in brightness (luminance).

The white balance correction values are applied for correction of the distribution ratios in the power ratio table when each of the luminance levels is set. When change in luminance level occurs, color temperature of the display image may possibly be deviated from a target color temperature level to some extent. The white balance correction values are applied for correcting such deviation in color temperature at each luminance level. When color is shifted in a virtual image optical system after light emission from light source device 100, such shift can be corrected in accordance with the correction values. Laser light having the wavelength of 520 nm has a distribution ratio set to one in the present exemplary embodiment, so that the white balance correction values are provided for each of the distribution ratio at the wavelength of 638 nm and the distribution ratio at the wavelength of 450 nm. The white balance correction values corresponding to the luminance level are added to the distribution ratios in the power ratio table for adjustment of the distribution ratios.

Image processing circuit 201 commands the color temperature and the luminance level to laser control circuit 202. Laser control circuit 202 sets resistor value (R_sc) and resistor value (R_th) indicated in FIG. 4A, through the processing of FIG. 10, to achieve the color temperature and the luminance level thus commanded.

With reference to FIG. 10 again, laser control circuit 202 acquires, from the power ratio table, the power ratio corresponding to the color temperature commanded by image processing circuit 201 (S101). Laser control circuit 202 subsequently calculates maximum value (Lout_p) of optical output in each of red (the wavelength of 638 nm), green (the wavelength of 520 nm), and blue (the wavelength of 450 nm) in accordance with the acquired power ratio and the luminance level commanded by image processing circuit 201 (S102).

Laser control circuit 202 subsequently acquires temperature from temperature sensor 111 (S103). Laser control circuit 202 obtains threshold current (Iout_th) for each color corresponding to present temperature, in accordance with a temperature characteristic of threshold current (Iout_th) (S104). As described in the tests 1 and 2, threshold current (Iout_th) for red laser light is obtained with use of a quartic approximate expression, whereas threshold current (Iout_th) for each of green laser light and blue laser light is obtained with use of a linear approximate expression.

Threshold current (Iout_th) can alternatively be calculated by substituting present temperature for an approximate expression function. Still alternatively, laser control circuit 202 can preliminarily store a table of temperature and threshold current (Iout_th) indicated in a corresponding manner such that threshold current (Iout_th) corresponding to present temperature is acquired from the table.

Laser control circuit 202 calculates resistor value (R_th) for each color in accordance with expression (1) from threshold current (Iout_th) thus acquired (S105).

Laser control circuit 202 further obtains slope efficiency (AP) for each color corresponding to present temperature, in accordance with a temperature characteristic of slope efficiency (AP) (S106). As described in the tests 1 and 2, slope efficiency (AP) for red laser light is obtained with use of a quadratic approximate expression, whereas slope efficiency (AP) for each of green laser light and blue laser light is obtained with use of a linear approximate expression.

Also in this case, slope efficiency (AP) can alternatively be calculated by substituting present temperature for an approximate expression function. Still alternatively, laser control circuit 202 can preliminarily store a table of temperature and slope efficiency (AP) indicated in a corresponding manner such that slope efficiency (AP) corresponding to present temperature is acquired from the table.

Laser control circuit 202 obtains maximum value (Iout_p) of driving current (Iout) corresponding to maximum value (Lout_p) of optical output calculated in step S102, in accordance with slope efficiency (AP) thus obtained (S107). Specifically, laser control circuit 202 configures an I-L characteristic for each color in accordance with threshold current (Iout_th) obtained in step S104 and slope efficiency (AP) obtained in step S106, and obtains maximum value (Iout_p) of driving current (Iout) corresponding to maximum value (Lout_p) of optical output in accordance with the I-L characteristic thus configured.

Laser control circuit 202 calculates resistor value (R_sc) for each color in accordance with expression (2) from obtained maximum value (Iout_p) of driving current (Iout) (S108). Specifically, laser control circuit 202 substitutes maximum value (Iout_p) of driving current (Iout) for each color obtained in step S107 for driving current (Iout) in expression (2), substitutes maximum value (1023) for gradation data (D_gr), and substitutes threshold current (Iout_th) obtained in step S104 for threshold current (Iout_th), to calculate resistor value (R_sc).

Laser control circuit 202 calculates resistor value (R_th) and resistor value (R_sc) in this manner and then executes limit determination (S109). Limit determination is executed to avoid damage to laser light sources 101a, 101b, 101c, and includes providing an upper limit to maximum value (Iout_p) of driving current (Iout) or maximum value (Lout_p) of optical output, and prohibiting update of resistor value (R_th) and resistor value (R_sc) if maximum value (Iout_p) of driving current (Iout) or maximum value (Lout_p) of optical output exceeds the upper limit. Limit determination will be described later with reference to FIG. 12A.

When update of the resistor values are allowed by limit determination, laser control circuit 202 sets resistor value (R_th) calculated in step S105 and resistor value (R_sc) calculated in step S108 at resistor 212 and resistor 211, respectively (S110). The processing according to expressions (1), (2) is executed in accordance with the resistor values thus updated, and laser light sources 101a, 101b, 101c for the respective colors are each supplied with driving current (Iout) corresponding to the gradation of the video signal.

Laser control circuit 202 then determines whether or not having received a command for change in color temperature or luminance level from image processing circuit 201 (S111). If there is received no command for change (NO in step S111), the processing flow returns to step S103 and laser control circuit 202 executes similar processing in accordance with new detection temperature. When there is change in detection temperature, resistor value (R_th) and resistor value (R_sc) are newly calculated to be set at resistor 212 and resistor 211, respectively. The values of resistor 212 and resistor 211 are updated in accordance with temperature change in this manner for adjustment of driving current (Iout).

If there is received the command for change in color temperature or luminance level from image processing circuit 201 (YES in step S111), the processing flow returns to step S101 and laser control circuit 202 executes processing in step S101 and in subsequent steps at the color temperature or the luminance level thus changed. Resistor value (R_th) and resistor value (R_sc) are thus calculated in accordance with the color temperature or the luminance level thus changed, and are set at resistor 212 and resistor 211, respectively. This leads to image display at new white balance or the new luminance level.

Figure 12A:
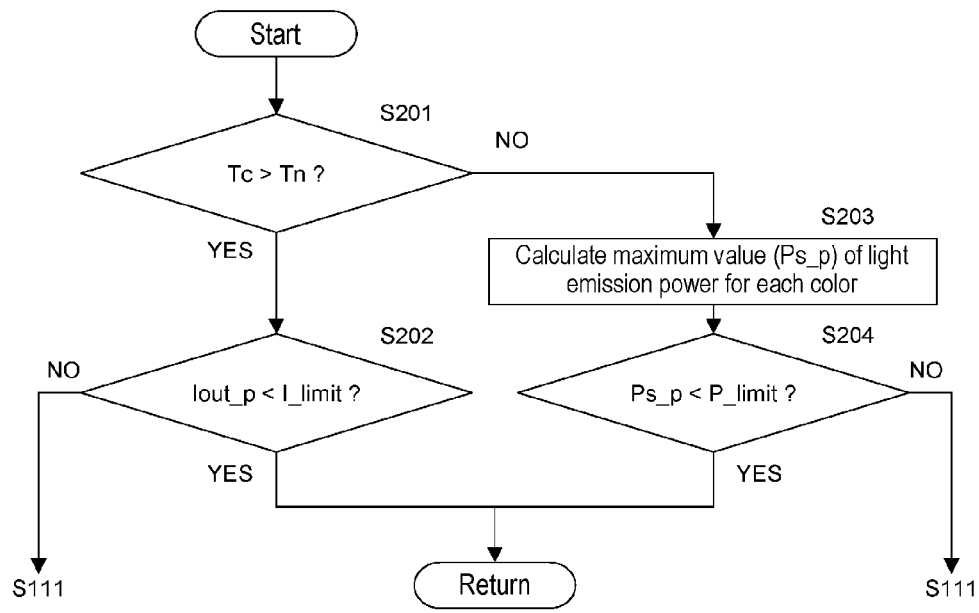
FIG. 12A is a flowchart depicting limit determination according to the exemplary embodiment.

FIG. 12A is a flowchart depicting limit determination in step S109 in FIG. 10.

Maximum value (Iout_p) of driving current (Iout) calculated in step S107 in FIG. 10 increases as temperature around laser light sources 101a, 101b, 101c increases. This is apparent from change in I-L characteristic indicated in FIG. 5. If maximum value (Iout_p) of driving current (Iout) increases excessively, light emitters of laser light sources 101a, 101b, 101c may be damaged. Laser light sources 101a, 101b, 101c are preferably protected by setting an upper limit value to maximum value (Iout_p) of driving current (Iout) in a high ambient temperature range.

In contrast, maximum value (Iout_p) of driving current (Iout) calculated in step S107 in FIG. 10 does not increase significantly in a low range of temperature around laser light sources 101a, 101b, 101c. The light emitters thus do not need to be protected by setting the upper limit value to maximum value (Iout_p) of driving current (Iout) in such a low ambient temperature range. However, temperature of the light emitters is largely different from temperature of casing accommodating the light emitters or temperature of boards provided with the light emitters in the low ambient temperature. Such temperature difference possibly causes structural distortion leading to damage to laser light sources 101a, 101b, 101c. Laser light sources 101a, 101b, 101c thus have light emission power provided with an upper limit value in the low ambient temperature range to restrain driving current (Iout) of laser light sources 101a, 101b, 101c, so as to prevent damage to laser light sources 101a, 101b, 101c due to temperature difference.

Limit determination of FIG. 12A is executed on the basis of the above idea, to provide an upper limit value to maximum value (Iout_p) of driving current (Iout) or maximum value (Ps_p) of light emission power of laser light sources 101a, 101b, 101c and protect laser light sources 101a, 101b, 101c. Herein, temperature around laser light sources 101a, 101b, 101c is categorized into a high range (first range) and a low range (second range) by boundary temperature Tn around normal temperature.

Laser control circuit 202 determines whether or not detection temperature Tc of temperature sensor 111 exceeds boundary temperature Tn (S201). If YES is determined in step S201, laser control circuit 202 determines whether or not maximum value (Iout_p) of driving current (Iout) is less than upper limit value (I_limit) (S202). In step S202, YES is determined if maximum value (Iout_p) of driving current (Iout) is less than upper limit value (I_limit) for laser light in every color, and NO is determined if maximum value (Iout_p) of driving current (Iout) is equal to or more than upper limit value (I_limit) for laser light in at least one color.

If YES is determined in step S202, the processing flow proceeds to step S110 in FIG. 10 and laser control circuit 202 allows setting of resistor value (R_th) and resistor value (R_sc) at resistor 212 and resistor 211, respectively. If NO is determined in step S202, the processing flow proceeds to step S111 in FIG. 10 and laser control circuit 202 prohibits setting of resistor value (R_th) and resistor value (R_sc) at resistor 212 and resistor 211, respectively. In the range (first range) of high temperature around laser light sources 101a, 101b, 101c, this restrains damage to the light emitters due to application of excessive driving current to laser light sources 101a, 101b, 101c.

If NO is determined in step S201, laser control circuit 202 calculates maximum value (Ps_p) of light emission power of laser light sources 101a, 101b, 101c (S203). Specifically, laser control circuit 202 divides maximum value (Lout_p) of optical output for each color obtained in step S102 in FIG. 10 by utilization efficiency T of laser light in an optical path from laser light sources 101a, 101b, 101c to dichroic mirror 105b, to calculate maximum value (Ps_p) of light emission power of laser light sources 101a, 101b, 101c.

Laser control circuit 202 determines whether or not calculated maximum value (Ps_p) of light emission power for each color is less than upper limit value (P_limit) (S204). In step S204, YES is determined if maximum value (Ps_p) of light emission power is less than upper limit value (P_limit) for laser light in every color, and NO is determined if maximum value (Ps_p) of light emission power is equal to or more than upper limit value (P_limit) for laser light in at least one color.

If YES is determined in step S204, the processing flow proceeds to step S110 in FIG. 10 and laser control circuit 202 allows setting of resistor value (R_th) and resistor value (R_sc) at resistor 212 and resistor 211, respectively. If NO is determined in step S204, the processing flow proceeds to step S111 in FIG. 10 and laser control circuit 202 prohibits setting of resistor value (R_th) and resistor value (R_sc) at resistor 212 and resistor 211, respectively. In the range (second range) of low temperature around laser light sources 101a, 101b, 101c, this restrains damage to laser light sources 101a, 101b, 101c due to structural distortion caused by temperature difference.

The processing of FIG. 12A includes categorizing, with boundary temperature Tn, the temperature range into the high temperature range (first range) and the low temperature range (second range). There can optionally be provided an intermediate temperature range between the high temperature range (first range) and the low temperature range (second range). In this case, the processing in step S202 in FIG. 12A is executed if detection temperature Tc is included in the first range, whereas the processing in step S203 and the processing in step S204 in FIG. 12A are executed if detection temperature Tc is included in the second range. When detection temperature Tc is included in the intermediate temperature range, the processing flow proceeds to step S110 in FIG. 10. Such a processing flow can achieve an effect similar to the effect achieved by the processing of FIG. 12A.

<Constant Term Adjustment>

Figure 12B:
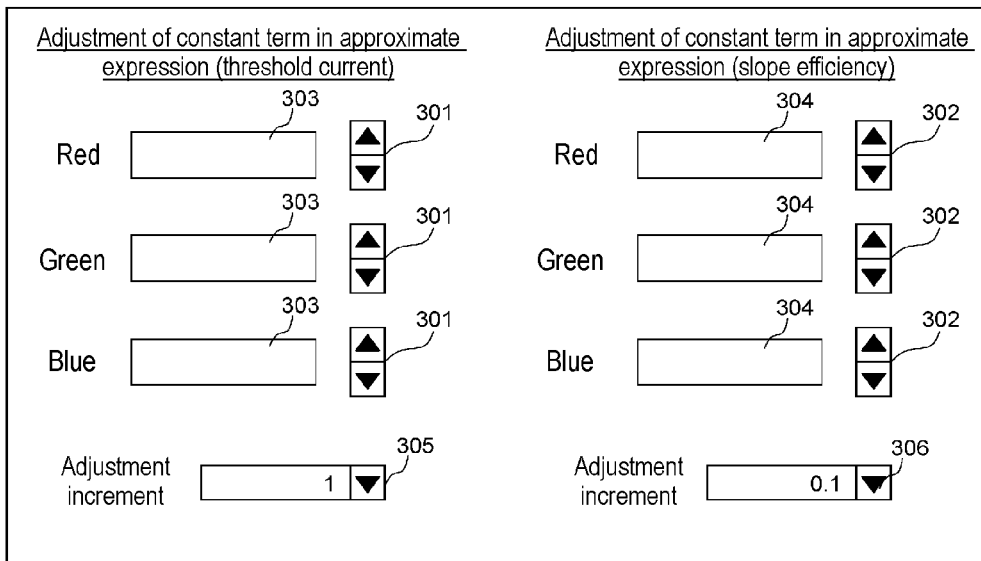
FIG. 12B is a view of a screen for input of adjustment of constant terms in approximate expressions respectively for approximation of threshold current and slope efficiency.

As described in tests 1 and 2, the approximate expression of threshold current (Iout_th) and the approximate expression of slope efficiency are shifted vertically by individual difference among laser light sources 101a, 101b, 101c. The constant term in each of the approximate expression of threshold current (Iout_th) and the approximate expression of slope efficiency is thus preferably adjusted in accordance with such individual difference to handle such shift. In this case, produced image display device 20 is connected with a terminal such as a personal computer, and the constant term in each of the approximate expressions is adjusted via the terminal. The terminal displays an input screen exemplarily depicted in FIG. 12B.

A producer manipulates increase/decrease keys 301, 302 to adjust constants in approximate expressions for the respective colors displayed in display columns 303, 304. The producer manipulates keys 305, 306 to set values increased or decreased by single manipulation of increase/decrease keys 301, 302. The producer manipulates increase/decrease keys 301 such that threshold current (Iout_th) for present temperature matches actual threshold current of laser light sources 101a, 101b, 101c. The producer also manipulates increase/decrease keys 302 such that slope efficiency for present temperature matches actual slope efficiency of laser light sources 101a, 101b, 101c.

Every time the constant term in any one of the approximate expressions changes, the terminal transmits a value of the changed constant term to image display device 20. Laser control circuit 202 applies each newly received value of the constant term in the approximate expression to the approximate expression to obtain threshold current (Iout_th) and slope efficiency according to the approximate expressions for present temperature, and transmits threshold current (Iout_th) and slope efficiency thus obtained to the terminal. The terminal displays a screen including threshold current (Iout_th) and the slope efficiency thus received. The producer also measures actual threshold current and slope efficiency of laser light source 101a, 101b, 101c with use of a measurement device.

The producer then manipulates the terminal to fix the constant terms in the approximate expressions when the threshold current and the slope efficiency thus measured match threshold current (Iout_th) and slope efficiency according to the approximate expressions, respectively. The terminal transmits the fixed constant terms to image display device 20. Laser control circuit 202 thus fixes present values of the constant terms in the approximate expressions as values of the constant terms in the approximate expressions for laser light sources 101a, 101b, 101c. The constant terms have thus been adjusted.

Effects of Exemplary Embodiment

The present exemplary embodiment described above achieves the following effects.

Threshold current (Iout_th) and slope efficiency for present temperature are obtained by approximation with use of the approximate expressions, from detection temperature of temperature sensor 111. Unlike PTL 1, the present exemplary embodiment does not need scanning, with laser light, screen 108 in the region outside the image display region, for checking the I-L characteristic of the laser light source at present temperature. Variation in optical output due to temperature change can thus be restrained appropriately, with no deterioration in laser light utilization efficiency.

As described above with reference to FIG. 6B, laser control circuit 202 applies, for laser light source 101a, slope efficiency approximated with use of a quadratic expression for temperature Ta around normal temperature to a range of temperature equal to or less than temperature Ta to approximate slope efficiency in this temperature range. Slope efficiency relative to temperature can thus be obtained appropriately also in the range of temperature equal to or less than temperature Ta, and output of laser light source 101a can be controlled accurately.

As described above with reference to FIG. 12B, laser control circuit 202 receives setting for changing the constant term in the approximate expression for approximation of change in threshold current (Iout_th) and the constant term in the approximate expression for approximation of change in slope efficiency. The approximate expressions thus become adaptable to individual difference among laser light sources 101a, 101b, 101c and achieve more accurate output control of laser light sources 101a, 101b, 101c.

As depicted in FIG. 2, temperature sensor 111 is disposed closer to laser light source 101a than laser light sources 101b, 101c. This disposition enables more precise detection of temperature around laser light source 101a for the red color and more accurate control of laser light source 101a for the red color, of which output characteristic is particularly likely to be affected by temperature. As depicted in FIG. 12A, laser control circuit 202 provides upper limit value (I_limit) to driving current (Iout) applied to laser light sources 101a, 101b, 101c when detection temperature Tc of temperature sensor 111 is included in the first temperature range (YES in step S201), and provides upper limit value (P_limit) to light emission power of laser light sources 101a, 101b, 101c when detection temperature Tc of temperature sensor 111 is included in the second temperature range lower than the first temperature range (NO in step S201). This restrains damage to laser light sources 101a, 101b, 101c when detection temperature Tc is included in any one of the first and second temperature ranges.

Laser control circuit 202 executes control depicted in FIG. 10 to achieve appropriate and smooth adjustment of luminance and white balance of a display image.

Modification Examples

The exemplary embodiment of the present disclosure has been described above. The present disclosure should not be limited to the above exemplary embodiment, and has application examples including the above exemplary embodiment as well as various modifications.

Figure 13:
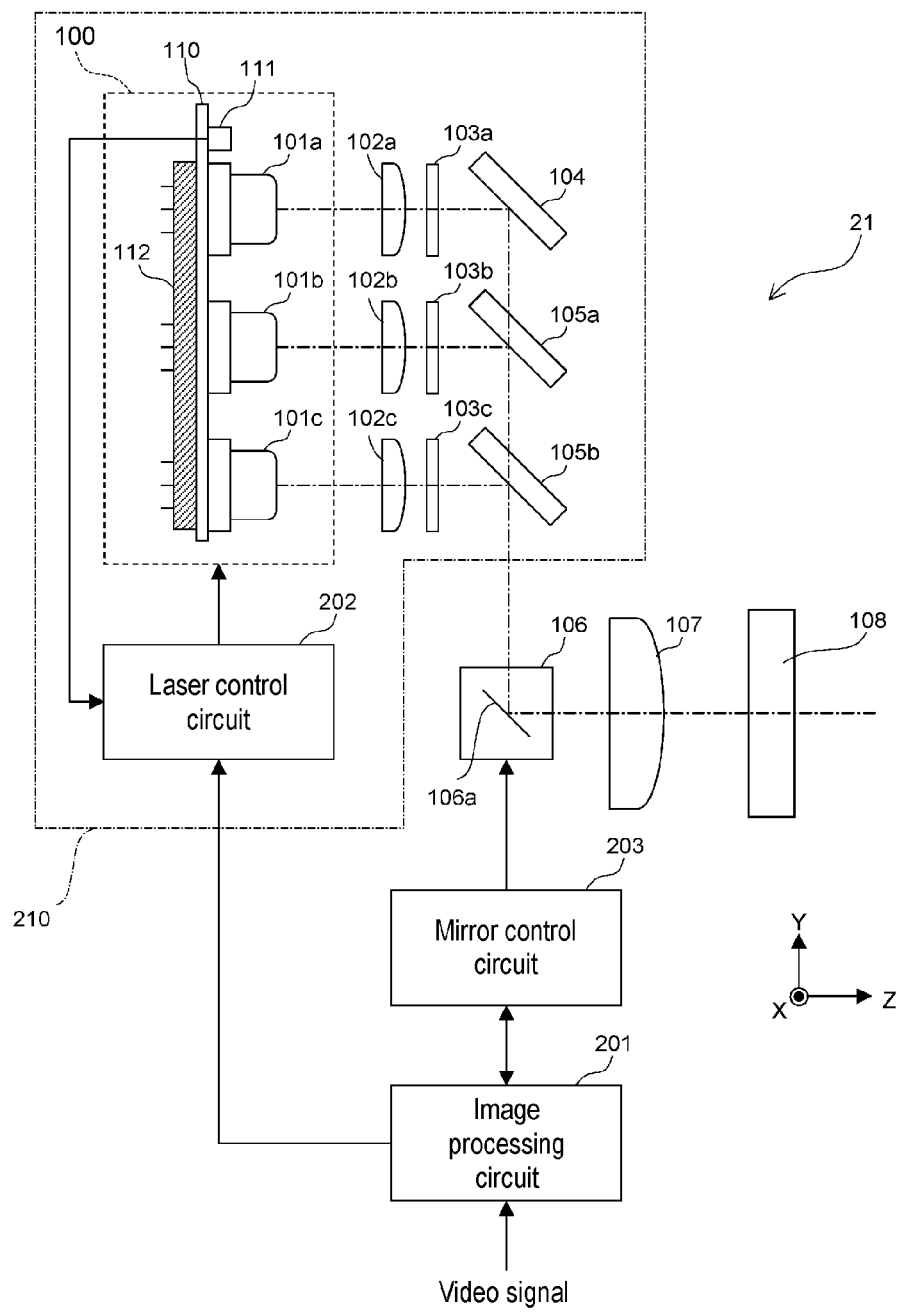
FIG. 13 is a block diagram of an irradiation light generator and a circuit included in the irradiation light generator in an image display device according to a modification example.
Figure 14:
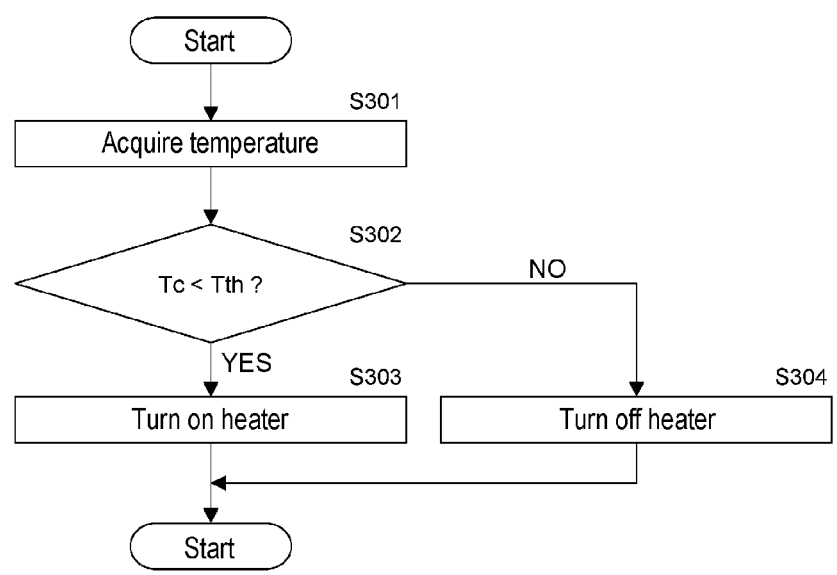
FIG. 14 is a flowchart depicting control of a heater according to the modification example.

For example, light source device 100 may further include heater 112 configured to increase temperature around laser light sources 101a, 101b, 101c as depicted in FIG. 13. In this case, laser control circuit 202 controls heater 112 through processing depicted in FIG. 14.

Laser control circuit 202 acquires detection temperature Tc of temperature sensor 111 (S301), and determines whether or not acquired detection temperature Tc is less than threshold Tth (S302). If detection temperature Tc is less than threshold Tth (YES in step S302), laser control circuit 202 drives heater 112 to increase temperature around laser light sources 101a, 101b, 101c (S303). If detection temperature Tc is equal to or more than threshold Tth (NO in step S302), laser control circuit 202 stops heater 112 (S304). Threshold Tth is set to a range from −20° C. to −10° C. inclusive, for example.

The configuration according to this modification example restrains excessive decrease in temperature around laser light sources 101a, 101b, 101c when image display device 20 is used in a cold area. This achieves increase in upper limit value (P_limit) in step S204 in FIG. 12A, and maximum value (Ps_p) of light emission power is unlikely to exceed upper limit value (P_limit) in step S204. A display image thus has high luminance even in a low temperature environment.

Screen 108 according to the above exemplary embodiment is positionally fixed. Screen 108 may optionally be shiftable along the Z axis during image display operation. Such shift of screen 108 achieves display of an image having a visual distance variable in depth.

Light source device 100 according to the above exemplary embodiment includes three laser light sources 101a, 101b, 101c. The present disclosure is not limited to this case in a number of laser light sources provided to light source device 100. For example, light source device 100 can be provided only with laser light source 101a. In this case, laser control circuit 202 obtains threshold current (Iout_th) of laser light source 101a with use of a quartic approximate expression and obtains slope efficiency of laser light source 101a with use of a quadratic approximate expression, to control laser light source 101a, as in the above exemplary embodiment. Laser control circuit 202 does not adjust white balance, but executes control for a monochromatic image such as luminance adjustment.

Driver unit 210 configured to drive laser light sources 101a, 101b, 101c is not necessarily limited in terms of the configuration to FIG. 4A, but can be configured differently to refer to threshold current (Iout_th) and slope efficiency. The flowchart of FIG. 10 is corrected appropriately in accordance with the configuration of driver unit 210.

Laser control circuit 202 according to the above exemplary embodiment obtains threshold current (Iout_th) and slope efficiency to control laser light sources 101a, 101b, 101c. Image processing circuit 201 may alternatively obtain threshold current (Iout_th) and slope efficiency and control laser light sources 101a, 101b, 101c in place of laser control circuit 202. In this case, detection temperature of temperature sensor 111 is received by image processing circuit 201, and laser control circuit 202 is replaced with a configuration including only driver unit 210. Image processing circuit 201 executes the processing of FIG. 10 to obtain resistor value (R_th) and resistor value (R_sc) and transmit resistor value (R_th) and resistor value (R_sc) thus obtained to laser control circuit 202 to cause laser control circuit 202 to set resistor value (R_th) and resistor value (R_sc) at resistor 212 and resistor 211, respectively, of driver unit 210.

The above exemplary embodiment provides application of the present disclosure to a head-up display mounted on passenger vehicle 1. The present disclosure is not limitedly applied to an on-vehicle image display device but is applicable also to a different type of an image display device.

Image display device 20 and irradiation light generator 21 are not configured limitedly as in FIG. 1C, FIG. 2, and FIG. 13, but can be modified as appropriate. First lens units 108a and second lens units 108b are alternatively provided integrally with screen 108, or are still alternatively provided by attaching a transparent sheet having these lens units to a base material of screen 108.

The exemplary embodiment of the present disclosure can be modified in various manners as appropriate within the scope of the technical idea recited in the claims.

The light source device and the image display device according to the present disclosure appropriately restrain variation in optical output due to temperature change, with no deterioration in laser light utilization efficiency, and are thus industrially useful.

What is claimed is:
1. A light source device comprising:
   a laser light source configured to emit laser light having a wavelength in a range from 635 nm to 645 nm inclusive;
   a temperature sensor configured to detect temperature around the laser light source; and
   a laser control unit configured to control the laser light source,
   wherein the laser control unit approximates, with use of a quartic expression, change in threshold current of the laser light source relative to temperature, and approximates, with use of a quadratic expression, change in slope efficiency of the laser light source relative to temperature, to obtain the threshold current and the slope efficiency of the laser light source corresponding to the temperature detected by the temperature sensor, and controls the laser light source in accordance with the threshold current and the slope efficiency thus obtained.

2. The light source device according to claim 1, wherein the laser control unit applies the slope efficiency approximated with use of the quadratic expression for predetermined temperature around normal temperature to a range of temperature equal to or less than the predetermined temperature, to approximate the slope efficiency in the temperature range.

3. The light source device according to claim 1, wherein the laser control unit receives setting for changing a constant term in the quartic expression for approximation of the change in the threshold current and a constant term in the quadratic expression for approximation of the change in the slope efficiency.

4. The light source device according to claim 1, further comprising an additional laser light source configured to emit laser light having a wavelength in a range other than the range from 635 nm to 645 nm inclusive,
wherein the laser control unit approximates, with use of a linear expression, change in threshold current of the additional laser light source relative to temperature, and approximates, with use of a linear expression, change in slope efficiency of the additional laser light source relative to temperature, to obtain the threshold current and the slope efficiency of the additional laser light source corresponding to the temperature detected by the temperature sensor, and controls the additional laser light source in accordance with the threshold current and the slope efficiency thus obtained.

5. The light source device according to claim 4, wherein the laser control unit receives setting for changing a constant term in the linear expression for approximation of the change in the threshold current and a constant term in the linear expression for approximation of the change in the slope efficiency.

6. The light source device according to claim 4, wherein the temperature sensor is disposed closer to the laser light source than the additional laser light source.

7. The light source device according to claim 4, wherein the laser control unit provides an upper limit value to driving current applied to each of the laser light source and the additional laser light source when the temperature detected by the temperature sensor is included in a predetermined first temperature range, and provides an upper limit value to light emission power of each of the laser light source and the additional laser light source when the temperature detected by the temperature sensor is included in a predetermined second temperature range lower than the first temperature range.

8. The light source device according to claim 4, further comprising a heater configured to heat peripheries of the laser light source and the additional laser light source,
wherein the laser control unit drives the heater when the temperature detected by the temperature sensor is lower than a predetermined threshold.

9. The light source device according to claim 4, wherein the additional laser light source includes two laser light sources configured to respectively emit laser light having a wavelength in a range from 510 nm to 530 nm inclusive and laser light having a wavelength in a range from 440 nm to 460 nm inclusive.

10. An image display device comprising:
the light source device according to claim 9;
a screen scanned two-dimensionally by laser light beams having different wavelengths and emitted from the light source device, to allow an image to be drawn on the screen;
a scanning unit configured to cause the laser light beams having the different wavelengths to scan the screen;
a drive unit configured to drive the scanning unit; and
an optical system configured to generate a virtual image of the image drawn on the screen,
wherein the laser control unit controls each of the laser light sources in accordance with the threshold current and the slope efficiency thus obtained for each of the laser light source and the two laser light sources.

11. An image display device comprising the light source device according to claim 10, wherein the laser control unit adjusts luminance and white balance of a display image in accordance with the threshold current and the slope efficiency thus obtained for each of the laser light sources.

* * * * *